US006400201B1

United States Patent
Inamori et al.

(10) Patent No.: US 6,400,201 B1
(45) Date of Patent: Jun. 4, 2002

(54) DELAY CIRCUIT AND RING OSCILLATOR INCORPORATING THE SAME

(75) Inventors: Masanori Inamori, Tenri; Syouji Sakurai, Nara; Toshiya Fujiyama; Hiroki Doi, both of Tenri, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/945,654

(22) Filed: Sep. 5, 2001

(30) Foreign Application Priority Data

Sep. 5, 2000 (JP) ........................................ 2000-269186

(51) Int. Cl.$^7$ ............................................. H03H 11/26
(52) U.S. Cl. ........................................ 327/277; 327/284
(58) Field of Search ................................... 327/261–264, 327/271, 276–278, 281, 284, 285, 288; 331/57

(56) References Cited

U.S. PATENT DOCUMENTS

| 5,434,525 A | * | 7/1995 | Leonowich | ................. | 327/278 |
| 5,532,969 A | * | 7/1996 | Houghton et al. | ........... | 365/226 |
| 6,097,231 A | * | 8/2000 | Moscaluk | .................... | 327/264 |
| 6,121,813 A | * | 9/2000 | Furuchi | ....................... | 327/278 |
| 6,271,730 B1 | * | 8/2001 | Abe et al. | .................... | 327/264 |
| 6,278,310 B1 | * | 8/2001 | Stave | .......................... | 327/261 |

FOREIGN PATENT DOCUMENTS

JP          A9172356          6/1997

* cited by examiner

*Primary Examiner*—My-Trang Nuton

(57) ABSTRACT

A delay circuit in accordance with the present invention includes: a first I$^2$L inverter and a second I$^2$L inverter connected in cascade with each other; and a capacitor interposed between a ground and a connecting point of the first and second inverters, wherein: the delay circuit further includes a current adjusting circuit having at least one third I$^2$L inverter with a plurality of output terminals at least one of which is connected to an input terminal of the third I$^2$L inverter; and the current adjusting circuit is connected to adjust a charge current of the capacitor. The configuration provides a delay circuit of simple circuit structure that accounts for a small area in an integrated circuit and that is capable of introducing any given delay and also provides a ring oscillator incorporating the delay circuit.

28 Claims, 16 Drawing Sheets

F I G. 3 (a)
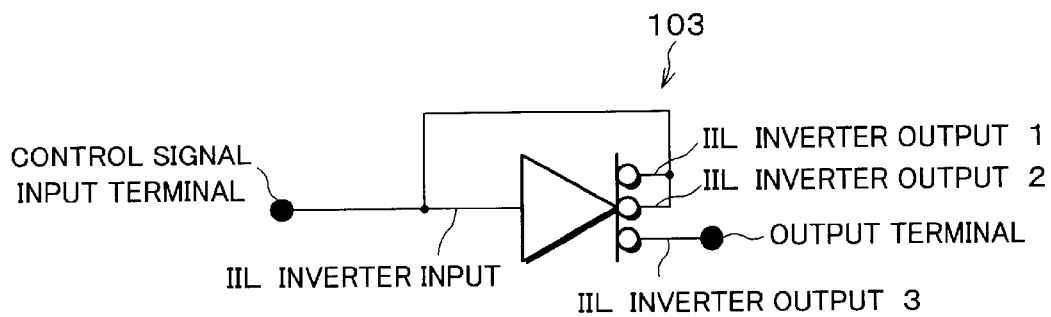
F I G. 3 (b)
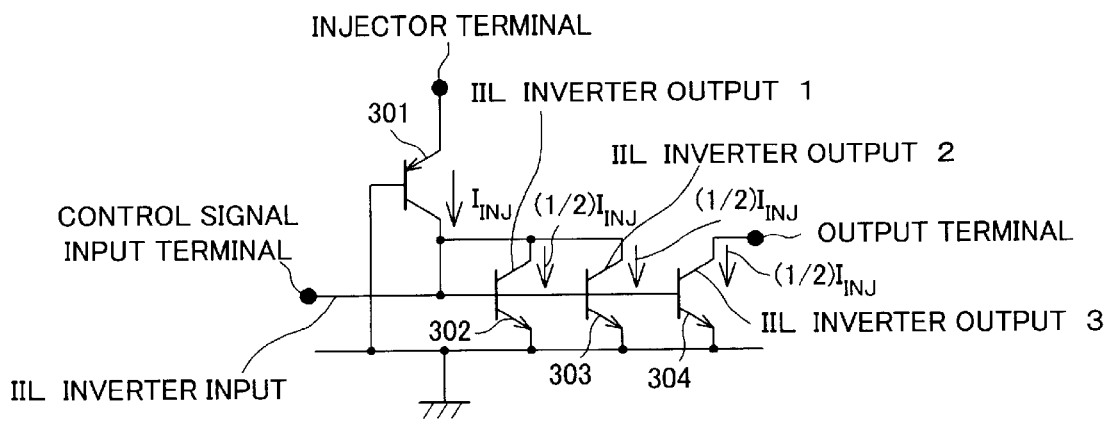
F I G. 3 (C)
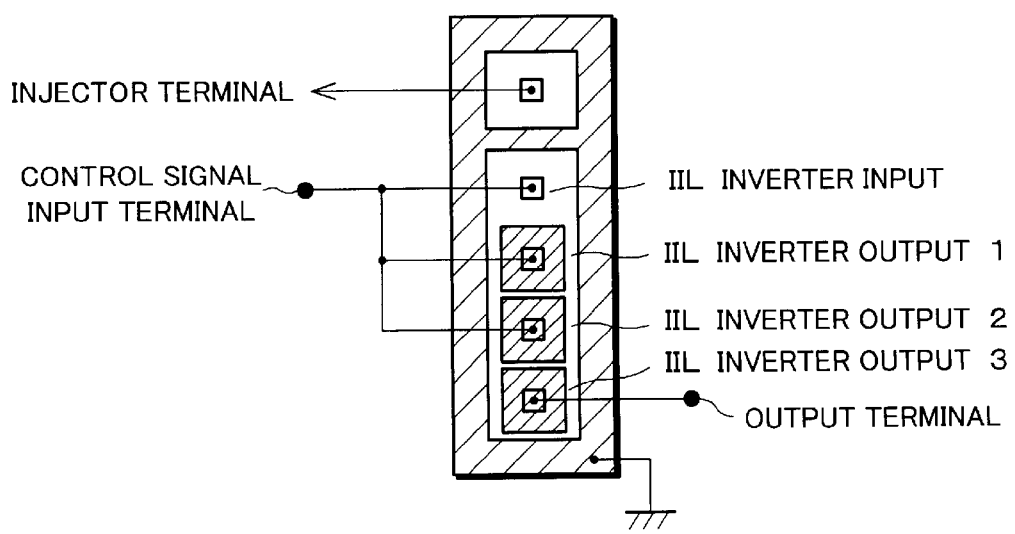

DELAY CIRCUIT AND RING OSCILLATOR INCORPORATING THE SAME

FIELD OF THE INVENTION

The present invention relates to an I²L delay circuit and a ring oscillator incorporating the same.

BACKGROUND OF THE INVENTION

FIG. 17 shows a delay circuit arranged in a conventionally known manner. In FIG. 17, reference numeral 1701 denotes a first I²L inverter, 1702 a second I²L inverter, and 1703 a capacitor. The delay introduced by the delay circuit of FIG. 17 is a time taken for the input terminal voltage of the I²L inverter 1702 (the voltage across the capacitor 1703) to grow to the threshold voltage of the I²L inverter 1702 as the capacitor 1703 coupled to the input of the I²L inverter 1702 is charged by the input terminal current of the I²L inverter 1702. The input terminal current of the I²L inverter 1702 is the collector current of a laterally structured p-n-p I²L transistor constituting the I²L inverter 1702 and is an injection current of the I²L inverter 1702.

Japanese Laid-Open Patent Application No. 9-172356/1997 (Tokukaihei 9-172356; published on Jun. 30, 1997) discloses a delay circuit capable of introducing variable delays. The delay circuit, including a plurality of inverting buffers and switches as shown in FIG. 18, alters the delay through the control of the switches.

In FIG. 18, reference numeral 1804 denotes a first inverting buffer, 1801a a second inverting buffer, 1801b a third inverting buffer, 1801c a fourth inverting buffer, 1801d a fifth inverting buffer, 1802a a first switch, 1802b a second switch, 1802c a third switch, 1802d a fourth switch, and 1803 a capacitor. At least one of the first to fourth switches 1802a–1802d is closed at any given time.

A distinction of the delay circuit in FIG. 18 lies in that the number of inverting buffers (other than the first inverting buffer 1804 and the second inverting buffer 1801a) involved in charging/discharging of the capacitor 1803 is changed through the opening/closing of the second to fourth switches 1802b–1802d connected in series with the respective third to fifth inverting buffers 1801b–1801d to produce delays of various values.

Specifically, in the delay circuit of FIG. 18, the more the connected inverting buffers, the greater the current for charging/discharging the capacitor 1803. Therefore, the delay can be varied by altering the number of the inverting buffers.

The foregoing prior art has following problems.

In the delay circuit of FIG. 17, if the capacitor 1703 is integrated in an integrated circuit (not shown), the capacitance (electrostatic capacitance) of the capacitor 1703, and hence the delay, become invariable. By contrast, if the capacitor 1703 is provided external to the integrated circuit, the delay is variable by changing the capacitance of the capacitor 1703; nevertheless, the need arises to dispose the capacitor 1703 externally to the integrated circuit and to equip the integrated circuit with a terminal at which the integrated circuit is coupled to the capacitor 1703. These requirements cause serious problems in mounting of the integrated circuit.

In the delay circuit of FIG. 18, the second to fifth inverting buffers 1801a–1801d involved in charging/discharging of the capacitor 1803 need be arranged to include a current supply (not shown) and require an equal number of switches (2a–2d), which renders the actual circuit configuration complex.

In addition, to obtain a substantially long delay, either the capacitance of the capacitor 1803 must be sufficiently large or the charge current of the capacitor 1803 must be sufficiently small. Integration of a large capacitance capacitor 1803 in an integrated circuit, however, gives rise to a problem of too large a chip area.

Further referring to the delay circuit of FIG. 18, since the charge current of the capacitor 1803 is alterable by changing the number of inverting buffers used, each energized inverting buffer conducts a minimum current to charge the capacitor 1803; for these reasons, it is difficult to reduce the charge current of the capacitor 1803 to a sufficiently low value. Even if the charge current is successfully decreased to a sufficiently low value, noise could cause the output from the delay circuit to fluctuate (change).

SUMMARY OF THE INVENTION

The present invention addresses the foregoing problems and has an object to present a delay circuit of simple configuration that accounts for a small area in an integrated circuit and that is capable of introducing any given delay and also to present a ring oscillator incorporating the delay circuit.

A delay circuit in accordance with the present invention, in order to achieve the above object, includes: a first I²L inverter and a second I²L inverter connected in cascade with each other; and a capacitor interposed between a ground and a connecting point of the first and second inverters and is characterized by the following features.

The delay circuit is characterized in that it includes at least one third I²L inverter with a plurality of output terminals at least one of which is connected to an input terminal of the third I²L inverter and that the third I²L inverter is connected to adjust a charge current of the capacitor.

In the foregoing invention, the delay refers to the time taken for the terminal voltage of the capacitor to reach the threshold voltage of the second I²L inverter as a result of the capacitor being charged by the current from the input of the second I²L inverter and is determined by the electrostatic capacitance of the capacitor.

However, a typical capacitor has a fixed electrostatic capacitance, and therefore the delay is invariable. By contrast, if the capacitor is provided external to the integrated circuit, the delay becomes variable by changing the electrostatic capacitance of the capacitor; nevertheless, the need arises to dispose the capacitor external to the integrated circuit and to equip the integrated circuit with a terminal at which the integrated circuit is coupled to the capacitor. These requirements pose serious problems in mounting of the integrated circuit.

To address this dilemma, the delay circuit includes at least one third I²L inverter connected to adjust a charge current of the capacitor. The provision of at least one third I²L inverter having an identical structure to that of the first and second I²L inverters enables adjustment of the charge current of the capacitor. The delay is therefore variable even if the capacitor has a fixed electrostatic capacitance. Further, the capacitor need not have a large electrostatic capacitance and therefore accounts for a reduced area in an integrated circuit; further integration of the integrated circuit is thus achieved.

The more the third I²L inverters, the more the electrostatic capacitance of the capacitor can be reduced.

It is preferable that the third I²L inverter is switchable by a control signal as to whether or not the third I²L inverter will contribute to adjustment of the charge current of the capacitor.

When this is the case, the third I²L inverter is switchable by the control signal as to whether or not the third I²L inverter will contribute to adjustment of the charge current of the capacitor. With two or more third I²L inverters provided, the amount by which the charge current of the capacitor is adjusted is variable through the control of the control signals. More precise delays therefore become available over a wider range.

It is preferable that the control signals are supplied to the third I²L inverters via an associated control signal input terminal of the third I²L inverters. When this is the case, external delay switching control becomes possible. In other words, the switching as to whether or not the third I²L inverter will contribute adjustment of the charge current of the capacitor is controllable by the control signal supplied to the third I²L inverters via the respective control signal input terminals. With two or more third I²L inverters provided, the charge current of the capacitor can be more precisely varied assuming a variety of values over a wider range through combinations of the control signals.

Incidentally, the charge current of the capacitor can be reduced by increasing the current passing through the third I²L inverter. By doing so, desirable large delays become available using a capacitor with a low electrostatic capacitance. This method, however, is not free from possible inconvenience: a reduced charge current may cause the output from the second I²L inverter to fluctuate: the voltage across the increasingly charged capacitor, when growing to the input threshold voltage of the second I²L inverter at which the output from the second I²L inverter inverts from the HIGH level to the LOW level, could be susceptible to noise and fluctuate around the input threshold voltage of the second I²L inverter.

To address this inconvenience, it is preferable that the control signal is supplied to the third I²L inverter via the second I²L inverter and causes the third I²L inverter to not contribute to adjustment of the charge current of the capacitor. When this is the case, the control signal supplied from the second I²L inverter causes the third I²L inverter to not contribute to adjustment of the charge current of the capacitor. As a result, since no adjustment in the charge current exists, once the voltage across the capacitor reaches the input threshold voltage of the second I²L inverter, the voltage across the capacitor is maintained stably.

Therefore, the voltage across the capacitor no longer fluctuates around the input threshold voltage of the second I²L inverter. The delay circuit is hence stable and supplies a steady output from t he second I²L inverter. Further, the configuration is so simple that mere line connection is added to feed the control signal as above and requires no additional gate or similar element; integration is therefore not degraded, and the delay circuit ensures a stable output.

It is preferable that the third I²L inverter includes: a transistor conducting a reference current; and a plurality of I²L transistors at least one of which is connected to the connecting point, with the remaining I²L transistors connected between the output terminal and the input terminal, and the plurality of I²L transistors conduct equal amounts of current having a value of the reference current divided by the number of the remaining I²L transistors.

When this is the case, if the remaining I²L transistors conduct no current, the charge current of the capacitor is not adjusted. By contrast, if the remaining I²L transistors conduct current (the reference current divided by the number of the remaining I²L transistors), an equal current is supplied to the at least one of I²L transistors via the connecting point.

The charge current of the capacitor is thus adjusted. The plurality of I²L transistors, since configured to form a kind of current mirror, facilitate integration.

It is preferable that the third I²L inverter includes: a transistor conducting a reference current; and a plurality of I²L transistors at least one of which is connected to the connecting point, with the remaining I²L transistors between the output terminal and the input terminal; the plurality of I²L transistors conduct equal amounts of current having a value of the reference current divided by the number of the remaining I²L transistors; and the control signals are applied to bases of the plurality of I²L transistors so that the third I²L inverter conducts current when the I²L transistor is on and conducts no current when the I²L transistors are off.

When this is the case, the control signals are applied to bases of the plurality of I²L transistors. Consequently, when the I²L transistors are off, the third I²L inverter conducts no current, and the charge current of the capacitor is not adjusted. By contrast, when the I²L transistor is on, all the I²L transistors conduct equal amounts of current (the reference current divided by the number of the remaining I²L transistors), and the charge current of the capacitor is adjusted. The plurality of I²L transistors, since configured to form a kind of current mirror, facilitate integration.

It is preferable that the second I²L inverter is realized by a plurality of the second I²L inverters connected in parallel. When this is the case, the current flowing from the second I²L inverters to the capacitor increases according to the number of the second I²L inverters connected in parallel, and the current adjust range of the capacitor is expanded accordingly. Thus, the delay circuit can produce delays of various values covering a wide range without excessively reducing the charge current of the capacitor.

It is preferable that a ring oscillator incorporates any one of forgoing delay circuits wherein: an odd number of I²L inverters are connected in cascade to an output of the delay circuit; and the output of the cascade connection is connected to an input of the first I²L inverter. When this is the case, the ring oscillator oscillates at oscillation frequencies in accordance with the delays produced by the delay circuit. Thus, a ring oscillator can be provided which highly precisely varies the oscillation frequency over a wide range and which has a simple circuit structure accounting for a small area in an integrated circuit and thus achieving high integration.

For a fuller understanding of the nature and advantages of the invention, reference should be made to the ensuing detailed description taken in conjunction with the accompanying drawings.

BRIEF DESCRIPTION OF THE DRAWINGS

FIG. 3(a) is a logic circuit diagram showing, as an example, an arrangement of a current adjusting circuit for the delay circuit; FIG. 3(b) is a circuit diagram showing the current adjusting circuit using transistor symbols; and FIG. 3(c) is an explanatory drawing showing the pattern of the delay circuit viewed from the top.

DESCRIPTION OF THE EMBODIMENTS

Referring to FIGS. 1 and 3–5, the following will describe an embodiment of the present invention.

Figure 1:
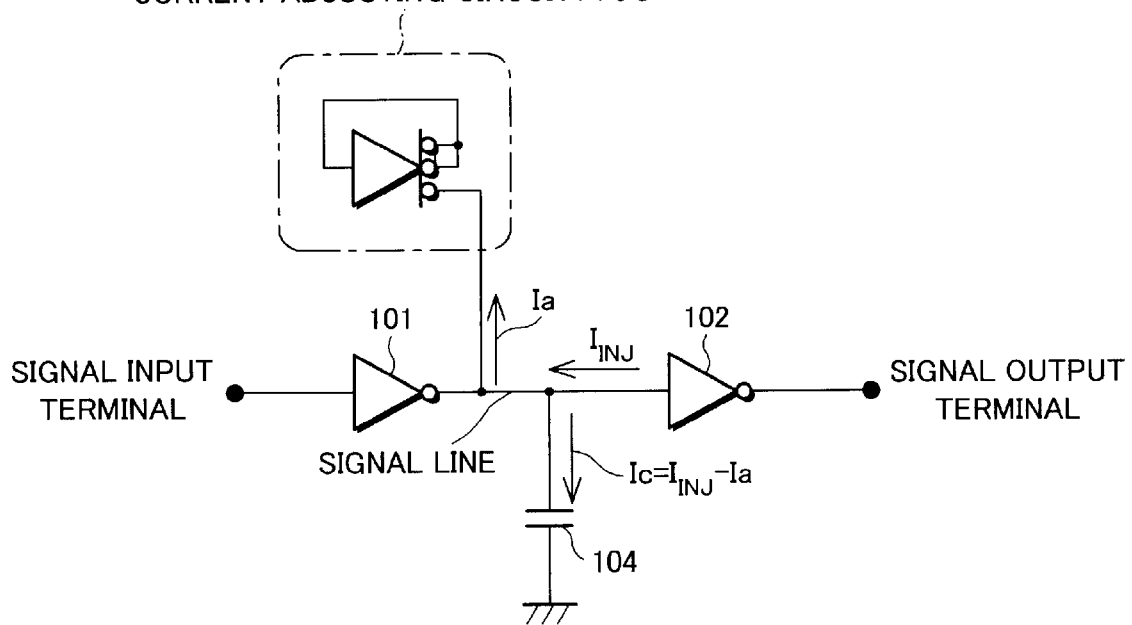
FIG. 1 is a circuit diagram showing, as an example, an arrangement of a delay circuit in accordance with the present invention.

A delay circuit of the present embodiment, as shown in FIG. 1, includes an I²L inverter 101, an I²L inverter 102, an I²L-based current adjusting circuit 103, and a capacitor 104. In FIG. 1, the I²L inverters are represented by logic circuit symbols for convenience.

The current adjusting circuit 103 will be first described in reference to FIG. 3(a).

FIG. 3(a) shows, as an example, a current adjusting circuit 103 of a current mirror configuration based on an I²L inverter represented by a logic circuit symbol. The I²L inverter in the current adjusting circuit 103 has a total of three output terminals. The outputs 1 and 2 of the I²L inverter are coupled to the input of the I²L inverter. The input of the I²L is extended to provide a control signal input terminal. The other output 3 of the I²L inverter is extended to form an output terminal.

Referring to FIG. 3 (b), there is shown the current adjusting circuit 103 using transistor symbols. The current adjusting circuit 103 is composed of a laterally structured p-n-p injector transistor 301 and n-p-n I²L transistors 302, 303, and 304.

The emitter of the injector transistor 301 is connected to the injector terminal, the base to the ground, and the collector to the control signal input terminal. The emitters of the I²L transistors 302, 303, and 304 are connected to the ground, and the bases to the collector of the injector transistor 301; the collectors of the I²L transistors 302 and 303 are connected to the collector of the injector transistor 301; and the collector of the I²L transistor 304 is connected to the output terminal.

Now, the current adjusting circuit 103 thus configured will be described in terms of operation. When the control signal input terminal has a high impedance, the injection current $I_{INJ}$ passes through the collector of the injector transistor 301 to the collectors of the "diode-connected" I²L transistors 302 and 303 (each of the I²L transistors 302 and 303 has the collector connected to the base and acts as a diode).

The emitters of the I²L transistors 302 and 303 are identical in shape and area. The collector currents of the I²L transistors 302 and 303 are therefore both half the injection current $I_{INJ}$ (=$I_{INJ}/2$).

The emitter of the I²L transistor 304 is identical in shape and area with the emitters of the I²L transistors 302 and 303. The I²L transistors 302–304 are mutually connected at the bases and have an equal base-emitter voltage. Therefore, the collector current ($I_{INJ}/2$) of the I²L transistor 304, which is the current appearing at the output terminal, is equal to each of the collector currents of the I²L transistors 302 and 303. In other words, the current adjusting circuit 103 constitutes a current output circuit of a current mirror configuration based on a single gate I²L inverter with the injection current $I_{INJ}$ as the reference current and half that current (=$I_{INJ}/2$) as the output current.

By contrast, when a LOW-level voltage (control signal) is applied to the control signal input terminal, none of the I²L transistors 302–304 conducts, allowing no current at all to appear at the output terminal.

As detailed in the foregoing, when the control signal input terminal has a high impedance, a current half the injection current $I_{INJ}$ appears at the output terminal (the output current from the current adjusting circuit 103 is "turned on"). By contrast, when the control signal input terminal is changed to the LOW level, no current appears at the output terminal (the output current from the current adjusting circuit 103 is "turned off"). Hence, external control of switching between delays becomes possible.

FIG. 3(c) shows, as an example, a pattern of the current adjusting circuit 103 provided as an integrated circuit. As shown in FIG. 3(c), the current adjusting circuit 103 is formed in a pattern including a single gate I²L inverter and readily integrated in I²L in an integrated circuit.

Description has been so far made in reference to FIG. 3 regarding a case where the I²L inverter has three output terminals with two of them connected to the control signal input terminal. The present invention, however, is not limited to this; alternatively, the I²L inverter has four or more output terminals three or more of which are connected to the control signal input terminal and two or more of which are connected to the output terminal.

FIG. 4(b) shows the configuration in FIG. 4(a) using transistor symbols. The current adjusting circuit 103 is composed of a laterally structured p-n-p injector transistor

401 and (m+n) n-p-n I²L transistors whose bases are mutually connected.

The emitter of the injector transistor 401 is connected to the injector terminal, the base to the ground, and the collector to the control signal input terminal. The emitters of the (m+n) I²L transistors are connected to the ground, and the bases to the collector of the injector transistor 401; the collectors of the m I²L transistors (corresponding to the I²L transistors 302 and 303 in FIG. 3(b)) are connected to the collector of the injector transistor 401; and the collectors of the remaining n I²L transistors (corresponding to the I²L transistor 304 in FIG. 3(b)) are connected to the output terminal.

The current adjusting circuit 103 of FIG. 4(b) will be described in terms of operation. When the control signal input terminal has a high impedance, the injection current $I_{INJ}$ passes through the collector of the injector transistor 401 to the collectors of the m "diode-connected" I²L transistors. The emitters of the m I²L transistors are identical in shape and area. The collector currents of the m I²L transistors are therefore all 1/m times the injection current $I_{INJ}$ (=$I_{INJ}$/m)

The emitters of the n I²L transistors are identical in shape and area with the emitters of the m I²L transistors. The (m+n) I²L transistors are mutually connected at the bases and have an equal base-emitter voltage. Therefore, the collector current ($I_{INJ}$/m) of each of the n I²L transistors, which form the current appearing at the output terminal, is equal to the collector current of each of the m I²L transistors. Under these situations, a current of n·($I_{INJ}$/m) appears at the output terminal.

By contrast, when a LOW-level voltage is applied to the control signal input terminal, none of the (m+n) I²L transistors conducts, allowing no current at all to appear at the output terminal.

As detailed in the foregoing, when the control signal input terminal has a high impedance, a current n/m times the injection current $I_{INJ}$ appears at the output terminal. By contrast, when the control signal input terminal is changed to the LOW level, no current appears at the output terminal.

Figure 4:
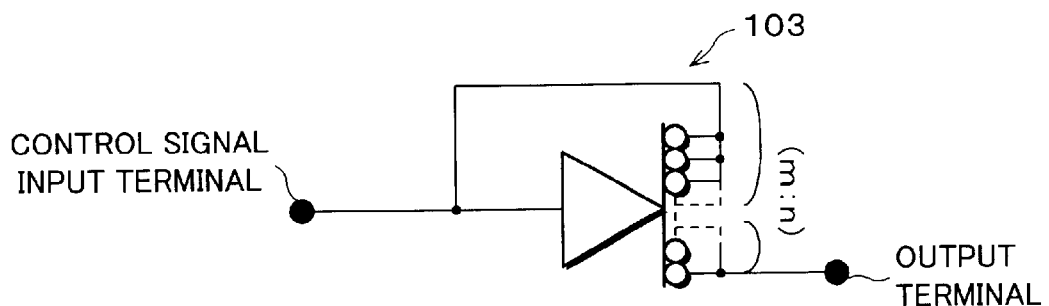
FIG. 4(a) is a logic circuit diagram showing, as an example, an arrangement of another current adjusting circuit for the delay circuit.
FIG. 4(b) is a circuit diagram showing the current adjusting circuit using transistor symbols.
Figure 4:
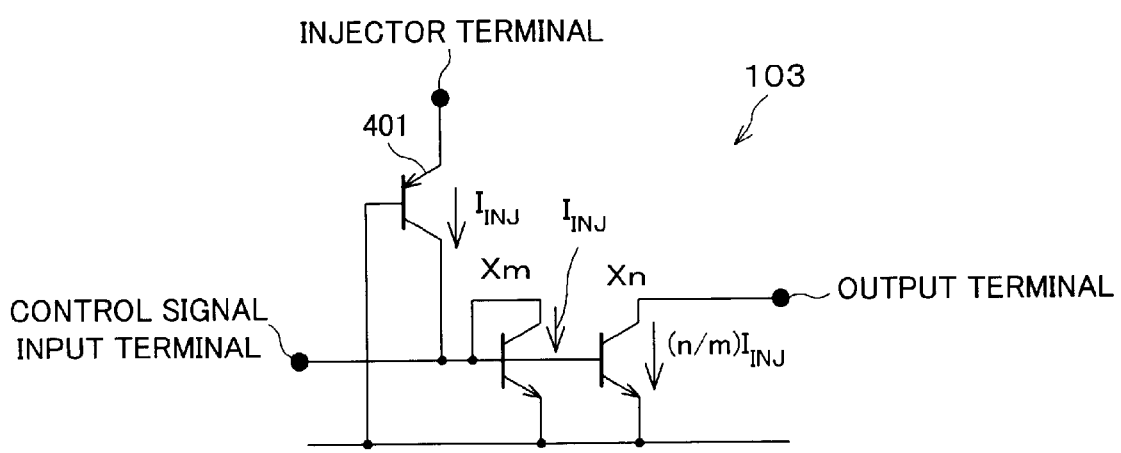

Hence, the current adjusting circuit 103 of FIG. 4 produces any given current output by altering the m:n ratio in the outputs of the I²L inverter with the injection current $I_{INJ}$ as the reference current. The charge current of the capacitor 104 in the delay circuit thus becomes adjustable by the output current from the current adjusting circuit 103. Through adjustment of the charge current, any given delay can be created so that switching between delays can be readily effected.

Now, referring to FIG. 1, the following will describe a delay circuit incorporating the current adjusting circuit 103 configured as in the foregoing.

In the delay circuit of FIG. 1, the I²L inverter 101 and the I²L inverter 102 are connected in cascade. The signal line connecting the inverters 101 and 102 branches out and is coupled to the capacitor 104 which is in turn grounded. At another branch, the signal line is coupled to the output terminal of the current adjusting circuit 103.

The current adjusting circuit 103 here is equivalent to that in FIG. 3(b), except that no control signal input terminal is provided, which is detailed immediately below. As mentioned earlier, the injection current $I_{INJ}$ is divided among the I²L transistors 302–304 with a current of $I_{INJ}$/2 passing through each I²L transistor; therefore, a current of $I_{INJ}$/2 appears at the output terminal of the current adjusting circuit 103 at any given time.

In the delay circuit of FIG. 1, if the signal input terminal is changed from the HIGH impedance to the LOW level, the output of the I²L inverter 101 is changed from the LOW level to the HIGH impedance. As a result, the capacitor 104 is charged by Ic=($I_{INJ}$–Ia), that is, the input current $I_{INJ}$ to the I²L inverter 102 less the current Ia flowing to the output terminal of the current adjusting circuit 103. As the voltage across the capacitor 104 grows to the input threshold voltage of the I²L inverter 102, the output of the I²L inverter 102 falls from the HIGH level to the LOW level. When the signal input terminal is at the HIGH level, the output of the I²L inverter 101 is at the LOW level, and the capacitor 104 discharges through the output of the I²L inverter 101.

In the delay circuit above, supposing that the delay at the gate of the I²L inverters 101 and 102 is short enough to disregard, the delay, i.e., the time from the HIGH-to-LOW switching of the input of the I²L inverter 101 to the HIGH-to-LOW switching of the output of the I²L inverter 102, is the time taken for the voltage across the capacitor 104 to reach the input threshold voltage of the I²L inverter 102 as a result of the charge current Ic charging the capacitor 104. This delay, denoted by T, is given by T=(C·V)/Ic, where C is the electrostatic capacitance of the capacitor 104 and V is the input threshold voltage of the I²L inverter 102.

In the delay circuit of FIG. 1, an I²L inverter with three outputs is used in the current adjusting circuit 103; two of the three outputs are connected to the input, leaving only one output that provides the output of the current adjusting circuit 103. The output current Ia from the current adjusting circuit 103 therefore is $I_{INJ}$/2, and the charge current Ic of the capacitor 104 is $I_{INJ}$–($I_{INJ}$/2)=($I_{INJ}$/2).

From the foregoing, the charge current Ic of the capacitor 104 is $I_{INJ}$ when there is provided no current adjusting circuit 103. Therefore, the delay circuit of FIG. 1, which includes the current adjusting circuit 103, introduces twice as long delays if the electrostatic capacitance C of the capacitor 104 remains unchanged. In other words, a capacitor with the electrostatic capacitance reduced in half will sufficiently introduce the same delay, and further integration of the circuit is achieved according to the reduction in capacitance.

The delay circuit in accordance with the present invention is not limited to the configuration in FIG. 1; alternatively, the current adjusting circuit 103 configured as in FIGS. 4(a), 4(b) may be used whereby as mentioned earlier, the current adjusting circuit 103 can generate any given current, and hence any desired delay, by altering the number of outputs of the I²L inverter with the injection current $I_{INJ}$ as the reference current.

That is, if the current adjusting circuit 103 of FIGS. 4(a), 4(b) is used, the charge current Ic of the capacitor 104 is $[I_{INJ}-(n/m)I_{INJ}]=[(m-n)/m] \cdot I_{INJ}$. This means that the delay is now m/(m−n) times as long as that introduced with no current adjusting circuit 103. In other words, a capacitor with the electrostatic capacitance reduced to (m−n)/m times will introduce the same delay, and further integration of the circuit is achieved according to the reduction in capacitance. The delay can be varied by altering m and n.

Now, referring to FIGS. 2(a), 2(b), another delay circuit in accordance with the present invention will be described. Here, for convenience, members that have the same function as those of the delay circuit in FIG. 1 are indicated by the same reference numerals and description thereof is omitted.

The delay circuit in FIG. 2(a) differs from the delay circuit FIG. 1(a) in that the current adjusting circuit 203 has a control signal input terminal to enable switching between delays in addition to the configuration of the current adjusting circuit 103 in FIG. 1.

FIG. 2(a) shows the delay circuit using logic symbols, while FIG. 2(b) shows the same delay circuit using transistor symbols. The I²L-based current adjusting circuit 203 has at the input thereof a control signal input terminal to enable switching between the LOW level and the HIGH impedance to control the output current from the current adjusting circuit 203 from on to off or vice versa; the current adjusting circuit 203 thus effects switching between delays.

Figure 2:
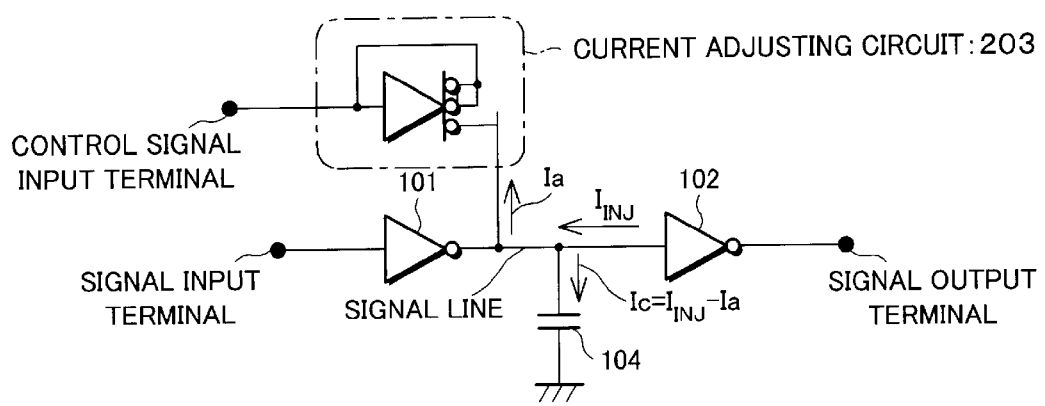
FIG. 2(a) is a logic circuit diagram showing, as an example, an arrangement of another delay circuit in accordance with the present invention.
FIG. 2(b) is a circuit diagram showing the same delay circuit using transistor symbols.
FIG. 2(c) is an explanatory drawing showing the pattern of the same delay circuit viewed from the top.
Figure 2:
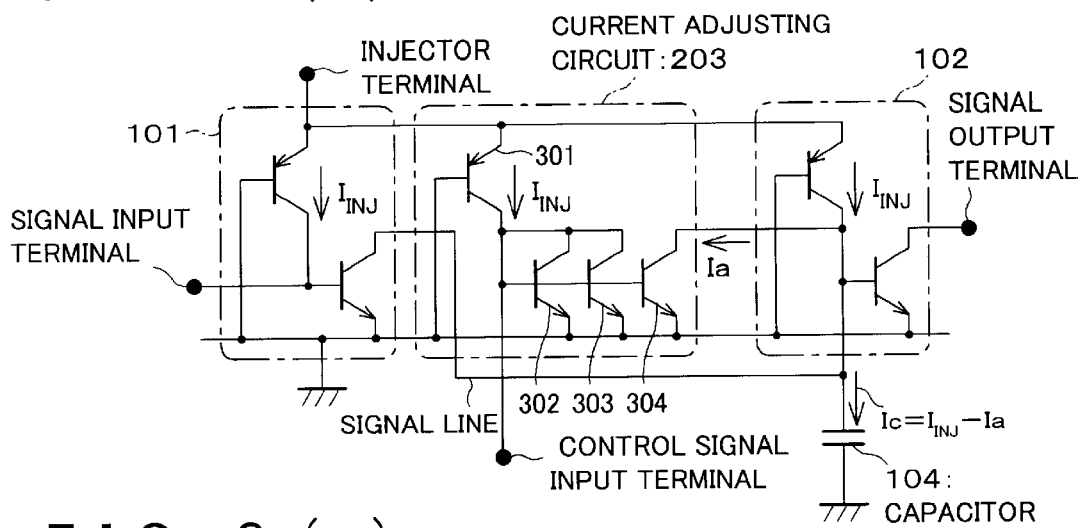
Figure 2:
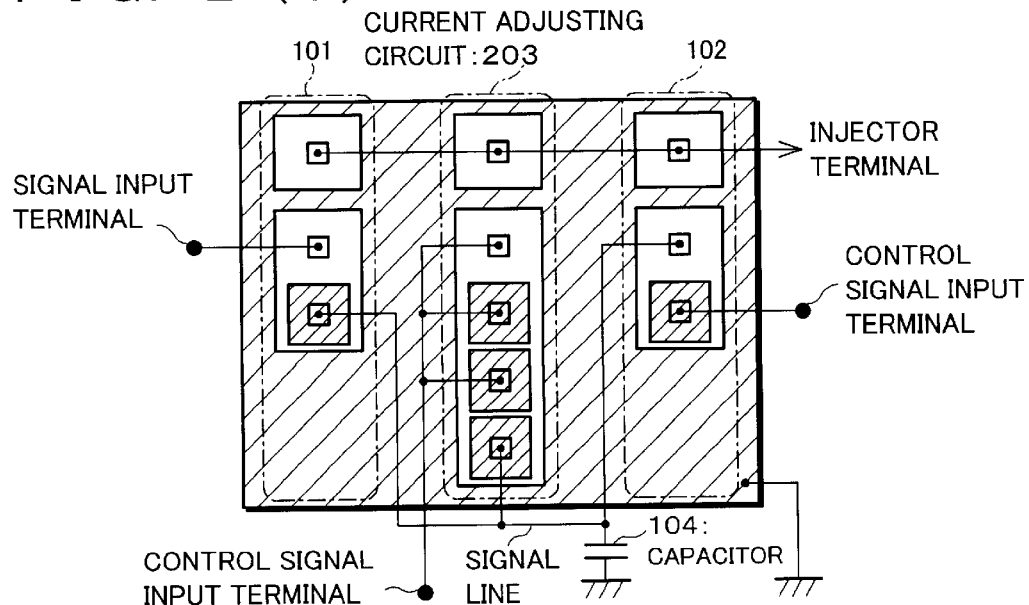

In the delay circuit of FIG. 2 (b), when the control signal input terminal is at the HIGH impedance, a current of $I_{INJ}/2$ passes through the I²L transistors 302–304, and the charge current Ic of the capacitor 104 is $I_{INJ}-(1/2)I_{INJ}=(1/2)I_{INJ}$. By contrast, when the control signal input terminal is changed to the LOW level, no current passes through the I²L transistors 302–304 any longer, and the charge current Ic of the capacitor 104 is $I_{INJ}$.

Therefore, by altering the control signal input terminal from the HIGH impedance state to the LOW level state, the delay circuit of FIG. 2(b) is caused to produce the same delay as the delay circuit without the current adjusting circuit 203. Also, by altering the control signal input terminal from the LOW level state to the HIGH impedance state, the delay circuit of FIG. 2(b) is caused to produce twice as long delays as the delay circuit without the current adjusting circuit 203. In other words, a change in the state of the control signal input terminal causes switching between delays (delays vary according to the state of the output terminal of the current adjusting circuit 203). FIG. 2(c) shows the delay circuit by means of an integrated circuit pattern viewed from the top, as an example.

Now, referring to FIG. 5, another delay circuit in accordance with the present invention will be described. Here, for convenience, members that have the same function as those of the delay circuit in FIG. 2 are indicated by the same reference numerals and description thereof is omitted.

Figure 5:
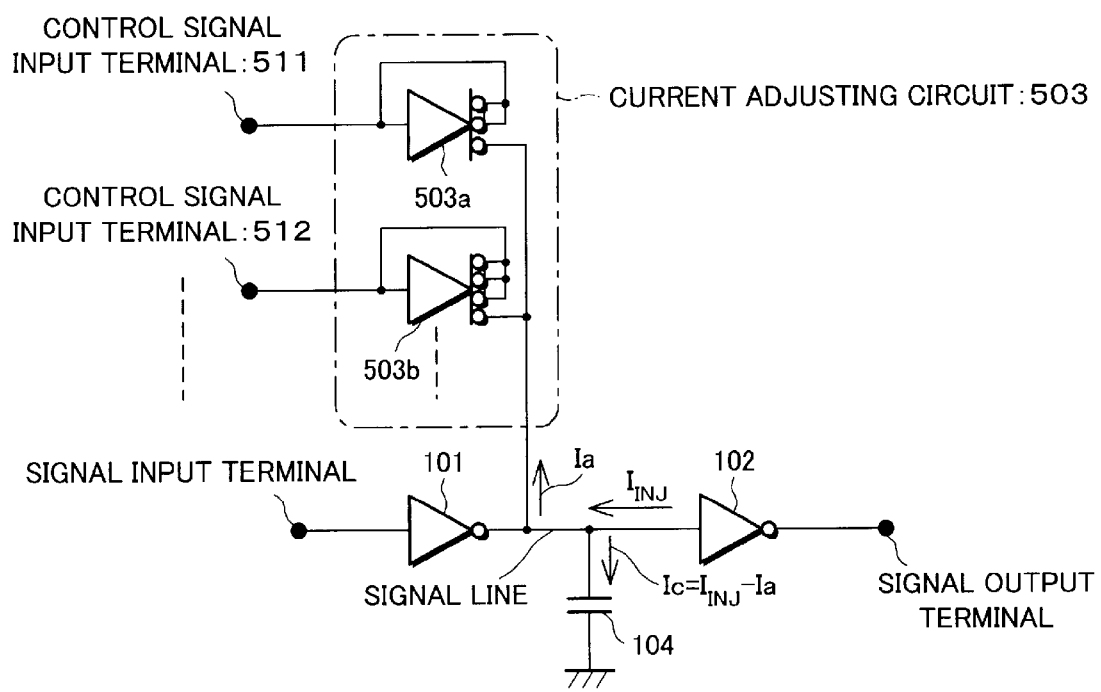
FIG. 5 is a logic circuit diagram showing, as an example, an arrangement of a further delay circuit in accordance with the present invention.

The delay circuit of FIG. 5 differs from the delay circuit of FIG. 2(a) in that the former includes a current adjusting circuit 503 in place of the current adjusting circuit 203.

In the current adjusting circuit 503, a plurality of current output circuits 503a, 503b, etc. (all of which are I²L inverters) composed of I²L inverters are connected in parallel (the output terminals of the current output circuits 503a, 503b, etc. are commonly connected to the signal line). The current output circuits 503a, 503b, etc. are provided with respective control signal input terminals 511, 512, etc. to effect switching between delays of various values and hence can switch between delays of various values covering a wide range.

In the delay circuit, the output current Ia from the current adjusting circuit 503 is the sum of the output currents from the current output circuits 503a, 503b, etc. As in the case of FIG. 2(a), by altering the control signal input terminals 511, 512, etc. from the HIGH impedance state to the LOW level state, the delay circuit of FIG. 5 is caused to produce the same delay as the delay circuit without the current adjusting circuit 503. Also, by altering the control signal input terminals from the LOW level state to the HIGH impedance state, the current output circuits 503a, 503b, etc. are caused to produce m/(m−n) times as long delays (on the assumption that the current output circuits 503a, 503b, etc. are each composed of m+n n-p-n I²L transistors as shown in FIGS. 4(a), 4(b)). For example, in the case of FIG. 5, the current output circuit 503a produces twice as long delays, while the current output circuit 503b produces 1.5 times as long delays.

The output current Ia from the current adjusting circuit 503 is the sum of the output currents from the current output circuits 503a, 503b, etc.; therefore, when the control signal input terminals 511, 512, etc. are changed from the LOW level state to the HIGH impedance state, the total delay grows equal to the sum of the output currents from the current output circuits 503a, 503b, etc., or grows so as to be equal to the sum of the magnifications of the delays introduced by the current respective output circuits 503a, 503b, etc.

The output current Ia from the current adjusting circuit 503 is the sum of the output currents from the current output circuits 503a, 503b, etc.; therefore, when the control signal input terminals 511, 512, etc. are changed from the HIGH impedance state to the LOW level state, the output currents from the current output circuits 503a, 503b, etc. are not involved in any delay (do not alter the charge current of the capacitor 104) (Ia=0). Accordingly, the charge current of the capacitor 104 is $I_{INJ}$, and the delay circuit of FIG. 5 produces the same delay as the delay circuit without the current output circuits 503a, 503b, etc.

In other words, since the output current Ia from the current adjusting circuit 503 is the sum of the output currents from the current output circuits 503a, 503b, etc., if some of the control signal input terminals are changed from the LOW level state to the HIGH impedance state with the others changed from the HIGH impedance state to the LOW level state, those current output circuits associated with the latter group of control signal input terminals are not involved in any change in delay (do not alter the charge current of the capacitor 104), and the delay circuit of FIG. 5 produces a delay so as to be equal to the sum of the magnifications of the delays introduced by those current output circuits associated with the former group of control signal input terminals.

As detailed in the foregoing, the charge current Ic (=$I_{INJ}$= Ia) of the capacitor 104 is altered by individually controlling (combining) the states of the control signal input terminals 511, 512, etc. in the current adjusting circuit 503. Thus, the delay can be precisely varied assuming a variety of values over a wide range, and desired delays will be readily available.

Now, referring to FIG. 6, another delay circuit in accordance with the present invention will be described. Here, for convenience, members that have the same function as those of the delay circuit in FIG. 5 are indicated by the same reference numerals and description thereof is omitted.

Figure 6:
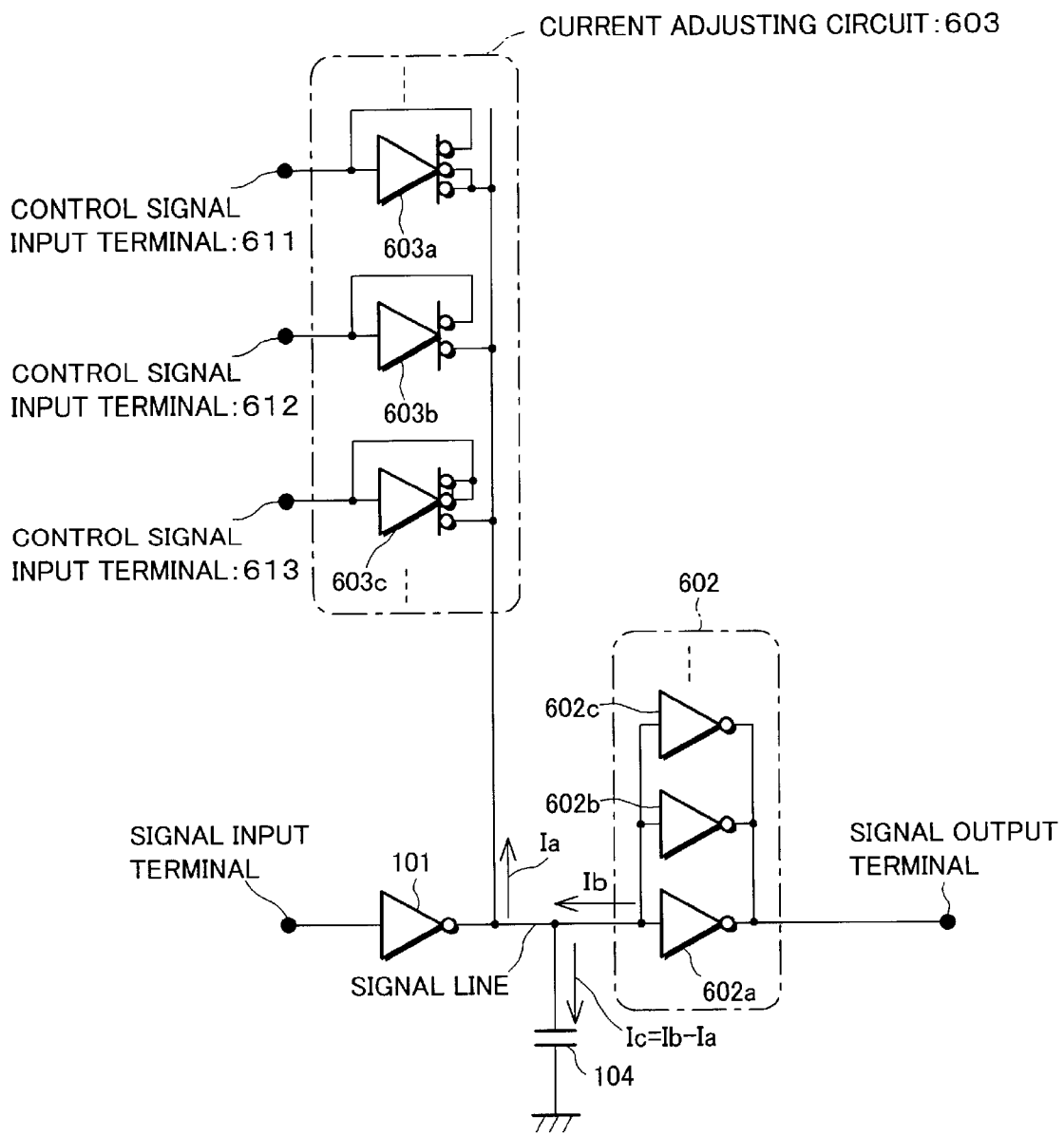
FIG. 6 is a logic circuit diagram showing, as an example, an arrangement of still another delay circuit in accordance with the present invention.

The delay circuit of FIG. 6 differs from the delay circuit of FIG. 5 in that the former includes an I²L inverter 602 in place of the I²L inverter 102 and that the current output circuits 603a, 603b, 603c, etc. in the current adjusting circuit 603 of the former have a different number of output terminals from the current output circuits 503a, 503b, 503c, etc in the current adjusting circuit 503 of the latter.

The I²L inverter 602 is composed of I²L inverters 602a, 602b, 602c, etc. connected in parallel. Supposing that the I²L inverter 602 is composed of n I²L inverters connected in parallel, since the input terminal currents of the I²L inverters 602a, 602b, 602c, etc. are all $I_{INJ}$, the total input terminal current of the I²L inverter 602 is Ib=n·$I_{INJ}$.

If the I²L inverter 602 was, for example, composed of a single I²L inverter as in FIG. 5, the current adjust range of the current adjusting circuit 603 would be $I_{INJ}$ or lower. Since the I²L inverter 602 is composed of n I²L inverters 602a, 602b, 602c, etc. in FIG. 6, the current adjust range is expanded to n·$I_{INJ}$. Accordingly, the charge current Ic of the capacitor 104 is Ic=Ib−Ia=(n·$I_{INJ}$)−Ia.

Thus, the delay can be precisely varied over a wide range through combinations of the input terminal current Ib of the I²L inverter 602 and the output current Ia from the current adjusting circuit 603 (variable through the control of the control signal input terminals 611, 612, 613, etc. of the current adjusting circuit 603 between the HIGH impedance and the LOW level) without excessively reducing the charge current Ic of the capacitor 104.

Now, referring to FIG. 7, another delay circuit in accordance with the present invention will be described. Here, for convenience, members that have the same function as those of the delay circuit in FIG. 2(a) are indicated by the same reference numerals and description thereof is omitted.

Figure 7:
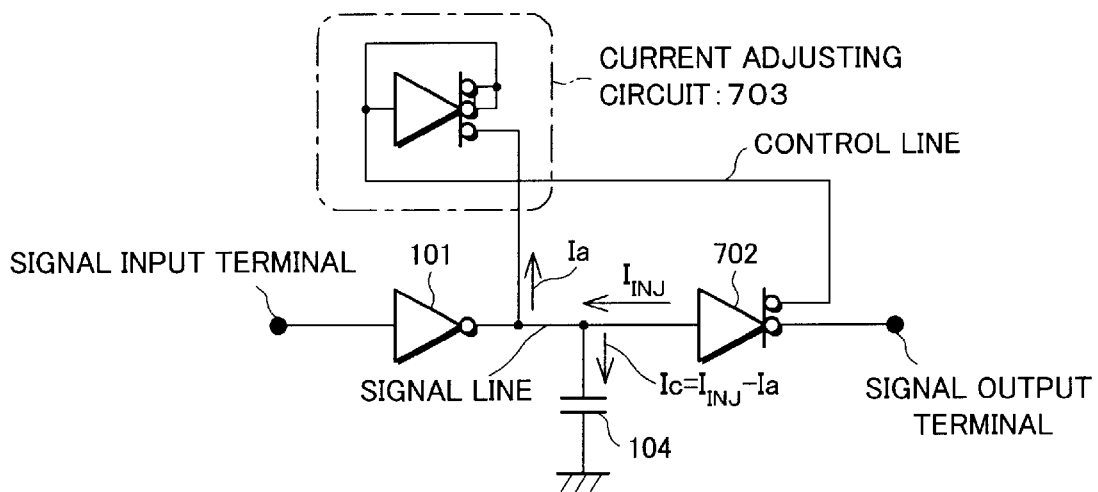
FIG. 7 is a logic circuit diagram showing, as an example, an arrangement of yet another delay circuit in accordance with the present invention.

The delay circuit of FIG. 7 differs from the delay circuit of FIG. 2(a) in the current adjusting circuits and the I²L inverters. The I²L inverter 102 of FIG. 2(a) has only one output terminal, whilst the I²L inverter 702 of FIG. 7 has two output terminals one of which forms an output terminal (signal output terminal) of the delay circuit, while the other of which is coupled via a control line to the input of the I²L inverter composing the current adjusting circuit 703. The current adjusting circuit 703 of FIG. 7 differs from the current adjusting circuit 203 of FIG. 2(a) in this last regard and consequently dispenses with the control signal input terminal.

The charge current Ic of the capacitor 104 can be reduced by increasing the output current Ia from the current adjusting circuit 703. By doing so, desirable large delays become available using a capacitor 104 with a low electrostatic capacitance. This method, however, is not free from possible inconvenience: a reduced charge current Ic may cause the output from the I²L inverter 702 to fluctuate: the voltage across the increasingly charged capacitor 104, when growing to the input threshold voltage of the I²L inverter 702 at which the output from the I²L inverter 702 inverts from the HIGH level to the LOW level, could be susceptible to noise and fluctuate around the input threshold voltage of the I²L inverter 702.

To address this problem, in the delay circuit of FIG. 7, the control line is provided to couple an output from the I²L inverter 702 to the input to the I²L inverter constituting the current adjusting circuit 703. In the configuration, once the capacitor 104 is sufficiently charged to develop. an input threshold voltage for the I²L inverter 702, causing the output from the I²L inverter 702 to invert from the HIGH level to the LOW level, the input to the I²L inverter constituting the current adjusting circuit 703 falls to the LOW level because of the coupling via the control line. As a result, the output current Ia from the current adjusting circuit 703 is turned off (cutoff), and the charge current Ic of the capacitor 104 increases from Ic=$I_{INJ}$–Ia to Ic=$I_{INJ}$.

In this manner, once the voltage across the capacitor 104 reaches the input threshold voltage of the I²L inverter 702, the voltage across the capacitor 104 is maintained stably (current Schmitt function) and no longer fluctuates around the input threshold voltage of the I²L inverter 702. The delay circuit is hence stable and supplies a steady output from the I²L inverter 702.

As detailed in the foregoing, in the delay circuit of FIG. 7 there is added no separate circuit, such as a gate, but only an output terminal and an control line to the I²L inverter 702; integration is therefore not degraded. Further, in the delay circuit of FIG. 7, the control line effects a current Schmitt function for the charge current Ic of the capacitor 104; a stable output is therefore available even with large delays.

Figure 8:
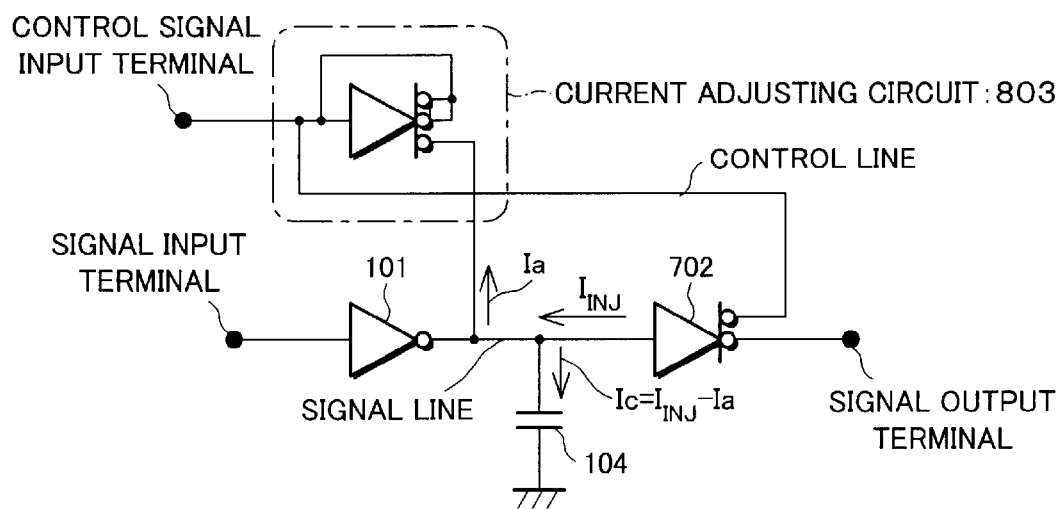
FIG. 8 is a logic circuit diagram showing, as an example, an arrangement of another delay circuit in accordance with the present invention.

FIG. 8 shows another delay circuit with a current Schmitt function. Here, for convenience, members that have the same function as those the delay circuit in FIG. 7 are indicated by the same reference numerals and description thereof is omitted.

The current adjusting circuit 803 in the delay circuit of FIG. 8 differs from that of FIG. 7 in that in the former, the input of the I²L inverter is extended to provide a control signal input terminal. The delay circuit of FIG. 8 is structured based on the delay circuit of FIG. 2: the I²L inverter 102 is replaced with an I²L inverter having two output terminals one of which is coupled to the input of the I²L inverter in the current adjusting circuit 203 via a connection line.

In the delay circuit of FIG. 8, the I²L-based current adjusting circuit 803 has at the input thereof a control signal input terminal to enable switching between the LOW level and the HIGH impedance to control the output current from the current adjusting circuit 803 from on to off or vice versa; the delay circuit of FIG. 8 thus effects switching between delays.

In the delay circuit of FIG. 8, when the control signal input terminal is in the HIGH impedance state, an output current Ia is supplied to the current adjusting circuit 803, and the charge current Ic of the capacitor 104 is reduced. With such a reduced charge current Ic, noise could cause the voltage across the capacitor 104 to fluctuate around the input threshold voltage of the I²L inverter 702 when the output from the I²L inverter 702 inverts from the HIGH level to the LOW level.

However, the configuration of FIG. 8 has a current Schmitt function similarly to the configuration of FIG. 7. Therefore, once the output of the I²L inverter 702 inverts from the HIGH level to the LOW level, the input to the I²L inverter constituting the current adjusting circuit 803 falls to the LOW level because of the coupling via the control line. As a result, the output current Ia from the current adjusting circuit 703 is turned off (cutoff), and the charge current Ic of the capacitor 104 increases from Ic=$I_{INJ}$–Ia to Ic=$I_{INJ}$. In this manner, once the voltage across the capacitor 104 reaches the input threshold voltage of the I²L inverter 702, the voltage across the capacitor 104 is maintained stably and no longer fluctuates around the input threshold voltage of the I²L inverter 702. The delay circuit is hence stable with the I²L inverter 702 capable of producing a steady output even with large delays.

By contrast, when the control signal input terminal is in the LOW level state, the charge current Ic of the capacitor 104 also increases from Ic=$I_{INJ}$–Ia to Ic=$I_{INJ}$, which shortens the delay.

That is, the delay circuit of FIG. 8 effects the same functions as the delay circuit of FIG. 7, and is additionally switchable between delays at any given time externally through the control signal input terminal.

As detailed in the foregoing, in the delay circuit of FIG. 8 there is added no separate circuit, such as a gate, but only an output terminal and an control line to the I²L inverter 702; integration is therefore not degraded. Further, in the delay circuit of FIG. 8, the control line effects a current Schmitt function for the charge current Ic of the capacitor 104; a stable output is therefore available even with large delays. Besides, the delay circuit of FIG. 8 is switchable between delays externally through the control signal input terminal.

Now, referring to FIG. 9, another delay circuit with a current Schmitt function will be described as an example. Here, for convenience, members that have the same function as those of the delay circuit in FIG. 5 are indicated by the same reference numerals and description thereof is omitted.

Figure 9:
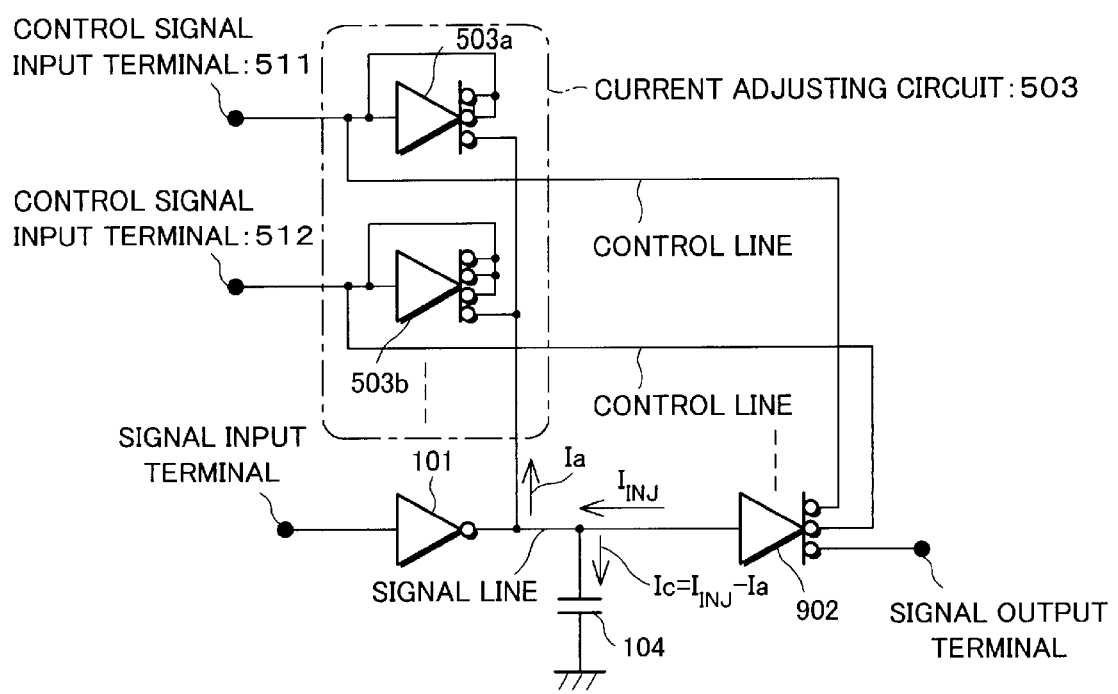
FIG. 9 is a logic circuit diagram showing, as an example, an arrangement of another delay circuit in accordance with the present invention.

The delay circuit of FIG. 9 differs from that of FIG. 8 in that in the former, the I²L inverter 902 has two or more output terminals which, except the one extended externally to provide an output terminal to the delay circuit, are coupled respectively via control lines to the inputs (i.e., the control signal input terminals 511, 512, etc.) of the current output circuits 503a, 503b, etc. (all of which are I²L inverters) in the current adjusting circuit 503.

In the delay circuit of FIG. 9, similarly to that of FIG. 8, the control signal input terminals 511, 512, etc. of the current adjusting circuit 503 are individually changed either to the LOW level or to the HIGH impedance to control the output current from the current adjusting circuit 503 from on to off or vice versa; the delay circuit of FIG. 9 thus effects switching between delays.

In the delay circuit of FIG. 9, when at least one of the control signal input terminals 511, 512, etc. is in the HIGH impedance state, an output current is supplied to the associated current output circuit, and the output current Ia from the current adjusting circuit 503 increases. As a result, the charge current Ic of the capacitor 104 decreases. With such a reduced charge current Ic, noise could cause the voltage across the capacitor 104 to fluctuate around the input threshold voltage of the I²L inverter 902 when the output of the I²L inverter 902 inverts from the HIGH level to the LOW level.

However, the configuration of FIG. 9 has a current Schmitt function similarly to the configuration of FIG. 8. Therefore, once the output of the I²L inverter 902 inverts from the HIGH level to the LOW level, the input to the associated I²L inverter in the current adjusting circuit 503 falls to the LOW level because of the coupling via the control line. As a result, the I²L inverter produces no current output and does not affect the charge current Ic at all. The charge current Ic increases by a corresponding amount. Once the voltage across the capacitor 104 reaches the input threshold voltage of the I²L inverter 902, the voltage across the capacitor 104 is maintained stably and no longer fluctuates around the input threshold voltage of the I²L inverter 902. The delay circuit is hence stable with the I²L inverter 902 capable of producing a steady output even with large delays.

Meanwhile, when at least one of the control signal input terminals 511, 512, etc. is in the LOW level state, the associated current output circuit produces no current output, and the charge current Ic of the capacitor 104 again increases by a corresponding amount. Delay therefore becomes shortened.

Since the output current Ia from the current adjusting circuit 503 is the sum of the output currents from the current output circuits 503a, 503b, etc., if some of the control signal input terminals are changed from the LOW level state to the HIGH impedance state with the others changed from the HIGH impedance state to the LOW level state, those current output circuits associated with the latter group of control signal input terminals are not involved in any change in delay (do not alter the charge current of the capacitor 104), and the delay circuit of FIG. 9 produces a delay so as to be equal to the sum of the magnifications of the delays introduced by those current output circuits associated with the former group of control signal input terminals.

As detailed in the foregoing, by individually controlling (combining) the states of the control signal input terminals 511, 512, etc. in the current adjusting circuit 503, the delay can be precisely varied assuming a variety of values over a wide range, and desired delays will be readily available.

That is, the delay circuit of FIG. 9 effects the same functions as the delay circuit of FIG. 8, and besides that, can individually control (combine) the states of the control signal input terminals 511, 512, etc.; thereby, the delay can be more precisely varied, and desired delays will be more readily available.

As detailed in the foregoing, in the delay circuit of FIG. 9, in comparison to the configuration of FIG. 5, there is added no separate circuit, such as a gate, but only one or more output terminals to the I²L inverter 902; integration is therefore not degraded. Further, in the delay circuit of FIG. 9, the control lines effect a current Schmitt function for the charge current Ic of the capacitor 104; a stable output is therefore available even with large delays. Besides, with the delay circuit of FIG. 9, the delay can be precisely varied assuming a variety of values over a wide range externally through the control signal input terminal.

Now, referring to FIG. 10, another delay circuit with a current Schmitt function will be described as an example. Here, for convenience, members that have the same function as those of the delay circuit in FIG. 6 are indicated by the same reference numerals and description thereof is omitted.

Figure 10:
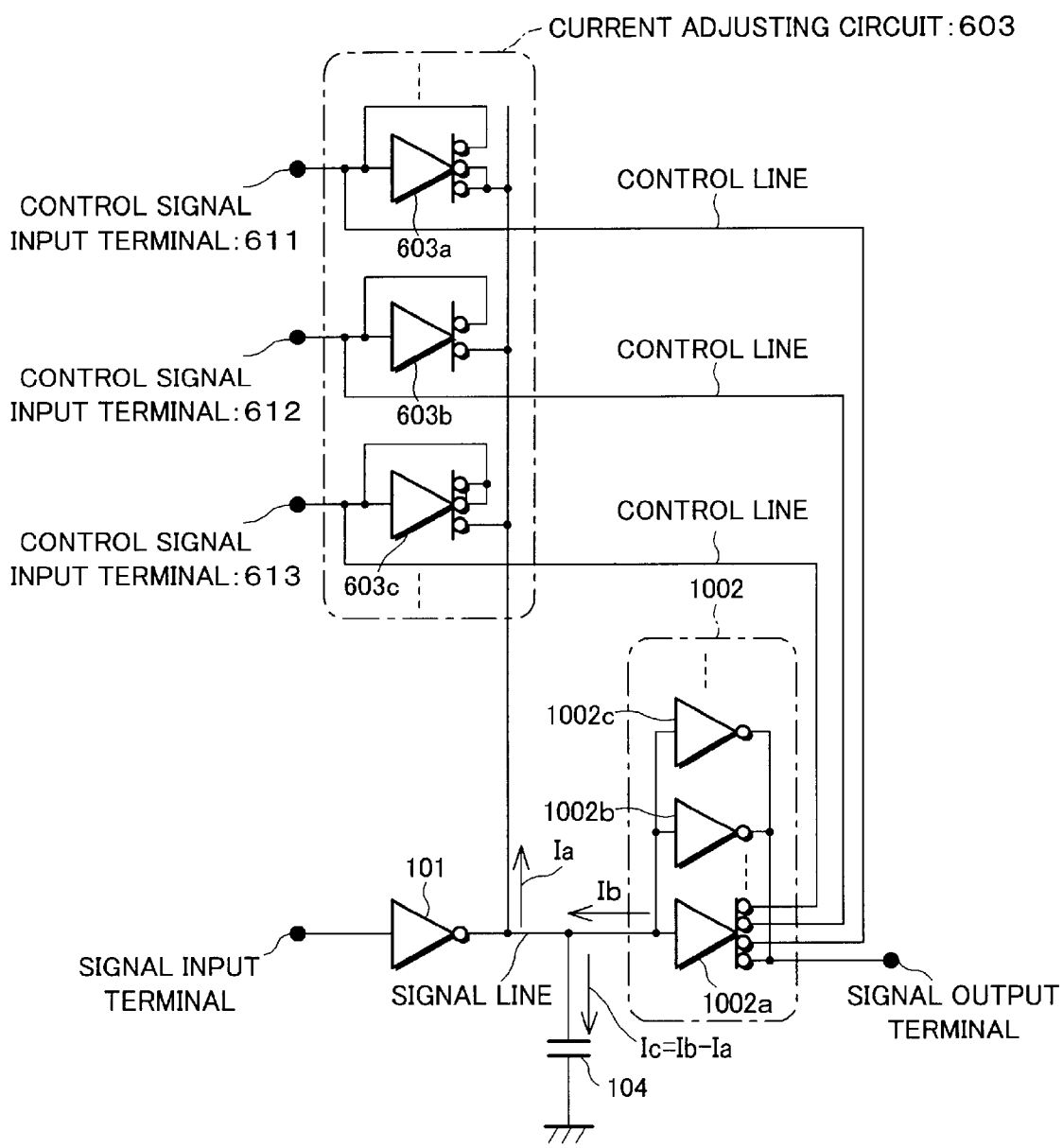
FIG. 10 is a logic circuit diagram showing, as an example, an arrangement of another delay circuit in accordance with the present invention.

The delay circuit of FIG. 10 differs from the delay circuit of FIG. 6 in that the I²L inverter 1002 includes I²L inverters 1002a, 1002b, 1002c, etc. connected in parallel one of which (the I²L inverter 1002a in FIG. 10) has a plurality of output terminals which, except the one extended externally to provide an output terminal (signal output terminal) to the delay circuit, are coupled respectively via control lines to the inputs (i.e., the control signal input terminals 611, 612, 613, etc.) of the current output circuits 603a, 603b, 603c, etc. in the current adjusting circuit 603.

In the delay circuit of FIG. 10, similarly to that of FIG. 9, the control signal input terminals 611, 612, etc. of the current adjusting circuit 603 are individually changed either to the LOW level or to the HIGH impedance to control the output current from the current adjusting circuit 603 from on to off or vice versa; the delay circuit of FIG. 10 thus effects switching between delays.

In the delay circuit of FIG. 10, when at least one of the control signal input terminals 611, 612, 613, etc. is in the HIGH impedance state, an output current is supplied to the associated current output circuit, and the output current Ia from the current adjusting circuit 603 increases. As a result, the charge current Ic of the capacitor 104 decreases. With such a reduced charge current Ic, noise could cause the voltage across the capacitor 104 to fluctuate around the input threshold voltage of the I²L inverter 1002 when the output of the I²L inverter 1002 inverts from the HIGH level to the LOW level.

However, the configuration of FIG. 10 has a current Schmitt function similarly to the configuration of FIG. 8. Therefore, once the output of the I²L inverter 1002 inverts from the HIGH level to the LOW level, the input to the associated I²L inverter in the current adjusting circuit 603 falls to the LOW level because of the coupling via the control line.

As a result, the I²L inverter produces no current output and does not affect the charge current Ic at all. The charge current Ic increases by a corresponding amount. Once the voltage across the capacitor 104 reaches the input threshold voltage of the I²L inverter 1002, the voltage across the capacitor 104 is maintained stably and no longer fluctuates around the input threshold voltage of the I²L inverter 1002. The delay circuit is hence stable with the I²L inverter 1002 capable of producing a steady output even with large delays.

Meanwhile, when at least one of the control signal input terminals 611, 612, etc. is in the LOW level state, the associated current output circuit produces no current output, and the charge current Ic of the capacitor 104 again increases by a corresponding amount. Delay therefore becomes shortened.

Since the output current Ia from the current adjusting circuit 603 is the sum of the output currents from the current output circuits 603a, 603b, 603c, etc., if some of the control signal input terminals are changed from the LOW level state to the HIGH impedance state with the others changed from the HIGH impedance state to the LOW level state, those current output circuits associated with the latter group of control signal input terminals are not involved in any change in delay (do not alter the charge current of the capacitor 104), and the delay circuit of FIG. 10 produces a delay so as to be equal to the sum of the magnifications of the delays introduced by those current output circuits associated with the former group of control signal input terminals.

As detailed in the foregoing, by individually controlling (combining) the states of the control signal input terminal 611, 612, etc. in the current adjusting circuit 603, the delay can be precisely varied and desired delays will be readily available.

Besides, since the input terminal currents of the n I²L inverters 1002a, 1002b, 1002c, etc. are all $I_{INJ}$, the total input terminal current of the I²L inverter 1002 is $Ib=n \cdot I_{INJ}$.

If the I²L inverter 1002 was, for example, composed of a single I²L inverter as in FIG. 5, the current adjust range of the current adjusting circuit 603 would be $I_{INJ}$ or lower. Since the I²L inverter 1002 is composed of n I²L inverters 1002a, 1002b, 1002c, etc., the current adjust range is expanded to $n \cdot I_{INJ}$. Accordingly, the charge current Ic of the capacitor 104 is $Ic=Ib-Ia=(n \cdot I_{INJ})-Ia$.

Thus, the delay can be precisely varied over a wide range through combinations of the input terminal current Ib of the I²L inverter 1002 and the output current Ia from the current adjusting circuit 603 (variable through the control of the control signal input terminals 611, 612, 613, etc. of the current adjusting circuit 603 between the HIGH impedance and the LOW level) without excessively reducing the charge current Ic of the capacitor 104.

As detailed in the foregoing, in the delay circuit of FIG. 10, in comparison to the configuration of FIG. 6, there is added no separate circuit, such as a gate, but only one or more output terminals to the I²L inverter 1002; integration is therefore not degraded. Further, in the delay circuit of FIG. 10, the control lines effect a current Schmitt function for the charge current Ic of the capacitor 104; a stable output is therefore available even with large delays.

Description has been so far made about the configuration in which the outputs of the I²L inverter 1002a constituting the I²L inverter 1002 are coupled to the respective inputs of the current output circuits 603a, 603b, 603c, etc. constituting the current adjusting circuit 603. The present invention, however, is not limited to this configuration; alternatively, the outputs of any one of the I²L inverters 1002b, 1002c, etc. constituting the I²L inverter 1002 may be coupled to those inputs.

Now, a ring oscillator (I²L ring oscillator) incorporating a foregoing delay circuit will be described.

Figure 11:
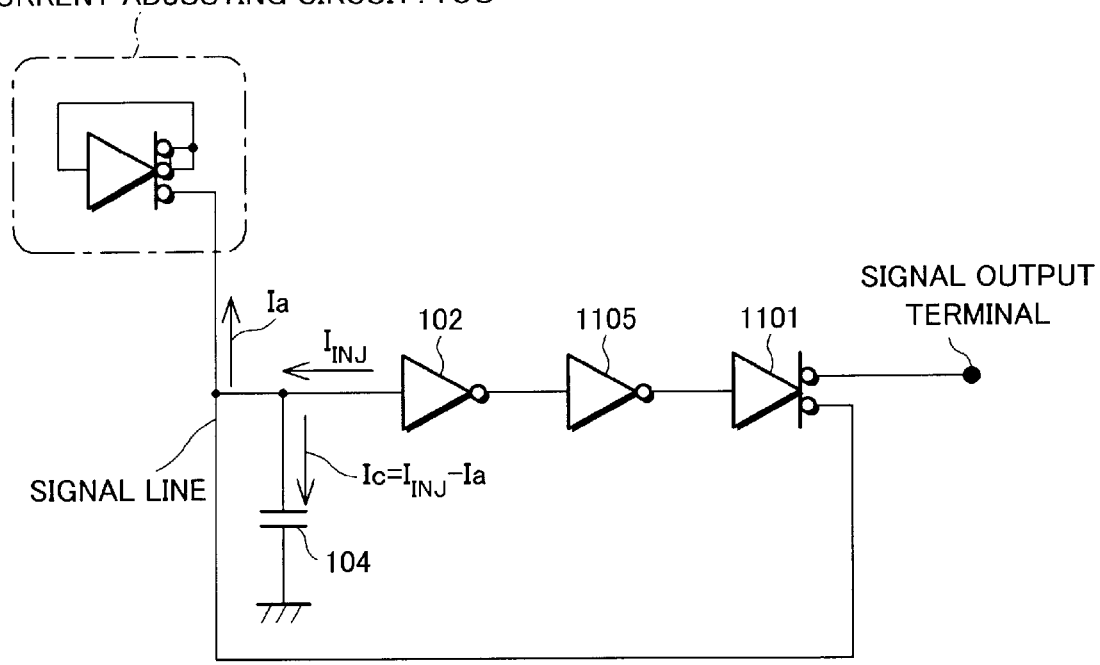
FIG. 11 is a logic circuit diagram of a ring oscillator incorporating the delay circuit in accordance with the present invention.

FIG. 11 is a circuit diagram showing a ring oscillator incorporating the delay circuit of FIG. 1 with an additional I²L inverter gate. Here, for convenience, members that have the same function as in FIG. 1 are indicated by the same reference numerals and description thereof is omitted.

The I²L inverter 1101 of FIG. 11 differs from the I²L inverter 101 of FIG. 1 in that the former is provided with two output terminals one of which is extended externally to provide an output terminal (signal output terminal), while the other of which is coupled to the input of the I²L inverter 102. Between the I²L inverters 102 and 1101 is provided another I²L inverter 1105.

Since the ring oscillator of FIG. 11 includes an equivalent of the delay circuit of FIG. 1, the oscillation frequency of the ring oscillator can be set to any given value by varying the charge current Ic ($=I_{INJ}-Ia$) of the capacitor 104.

Figure 12:
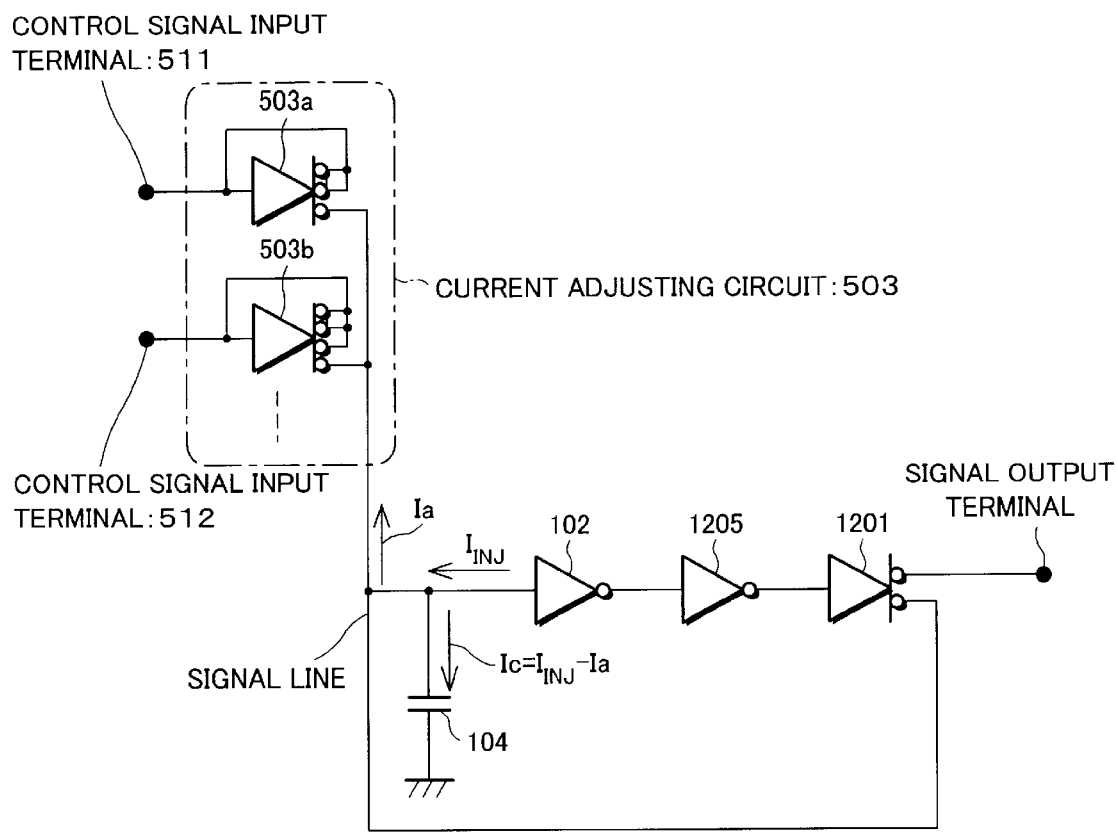
FIG. 12 is a logic circuit diagram of another ring oscillator incorporating the delay circuit in accordance with the present invention.

FIG. 12 is a circuit diagram showing a ring oscillator incorporating the delay circuit of FIG. 5 with an additional I²L inverter gate. Here, for convenience, members that have the same function as in FIG. 5 are indicated by the same reference numerals and description thereof is omitted.

The I²L inverter 1201 of FIG. 12 differs from the I²L inverter 101 of FIG. 5 in that the former is provided with two output terminals one of which is extended externally to provide an output terminal, while the other of which is coupled to the input of the I²L inverter 102. Between the I²L inverters 102 and 1201 is provided another I²L inverter 1205.

Since the ring oscillator of FIG. 12 includes an equivalent of the delay circuit of FIG. 5, and the output current Ia from the current adjusting circuit 503 is the sum of the output currents from the current output circuits 503a, 503b, etc., if some of the control signal input terminals are changed from the LOW level state to the HIGH impedance state with the others changed from the HIGH impedance state to the LOW level state, those current output circuits associated with the latter group of control signal input terminals are not involved in any change in delay (do not alter the charge current of the capacitor 104), and the delay circuit of FIG. 12 produces a delay so as to be equal to the sum of the magnifications of the delays introduced by those current output circuits associated with the former group of control signal input terminals. As detailed in the foregoing, the charge current Ic ($=I_{INJ}-Ia$) of the capacitor 104 is altered by individually controlling (combining) the states of the control signal input terminals 511, 512, etc. in the current adjusting circuit 503. Thus, the delay can be precisely varied assuming a variety of values over a wide range, and desired delays will be readily available. The oscillation frequency of the ring oscillator of FIG. 12 can thereby be set to any given value.

Figure 13:
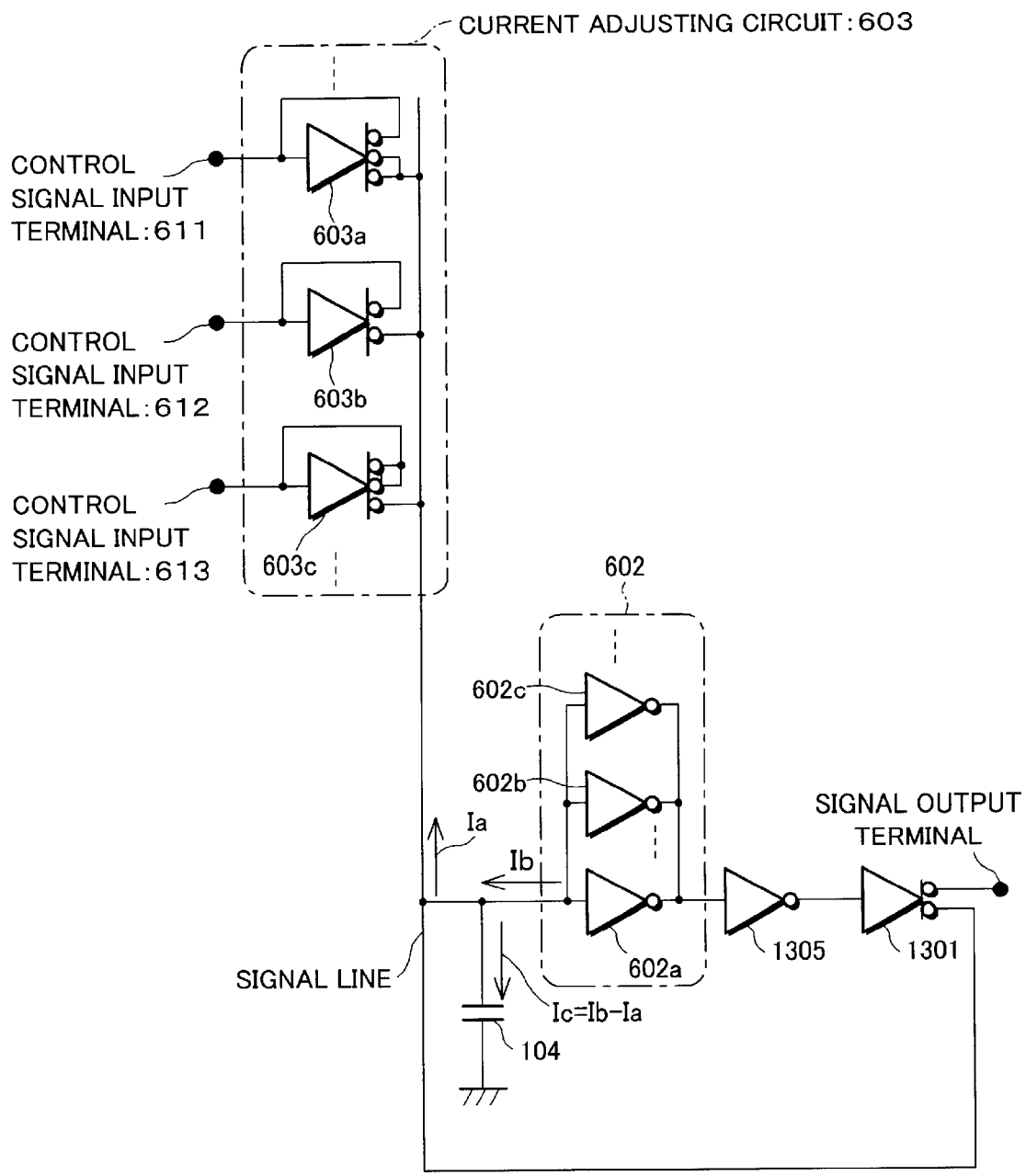
FIG. 13 is a logic circuit diagram of still another ring oscillator incorporating the delay circuit in accordance with the present invention.

FIG. 13 is a circuit diagram showing a ring oscillator incorporating the delay circuit of FIG. 6 with an additional I²L inverter gate. Here, for convenience, members that have the same function as in FIG. 6 are indicated by the same reference numerals and description thereof is omitted.

The I²L inverter 1301 of FIG. 13 differs from the I²L inverter 101 of FIG. 6 in that the former is provided with two output terminals one of which is extended externally to provide an output terminal (signal output terminal), while the other of which is coupled to the input of the I²L inverter 602. Between the I²L inverters 602 and 1301 is provided another I²L inverter 1305.

Since the ring oscillator of FIG. 13 includes an equivalent of the delay circuit of FIG. 6, and the I²L inverter 602 is composed of n I²L inverters 602a, 602b, 602c, etc., the current adjust range is expanded to $n \cdot I_{INJ}$. Accordingly, the charge current Ic of the capacitor 104 is $Ic=Ib-Ia=(n \cdot I_{INJ})-Ia$. Thus, the delay can be precisely varied over a wide range through combinations of the input terminal current Ib of the I²L inverter 602 and the output current Ia from the current adjusting circuit 603 (variable through the control of the control signal input terminals 611, 612, 613, etc. of the current adjusting circuit 603 between the HIGH impedance and the LOW level) without excessively reducing the charge current Ic of the capacitor 104.

As detailed in the foregoing, the charge current Ic (=$I_{INJ}$–Ia) of the capacitor 104 is altered by individually controlling (combining) the states of the control signal input terminals 611, 612, 613, etc. in the current adjusting circuit 603. Thus, the delay can be precisely varied assuming a variety of values over a wide range, and desired delays will be readily available. The oscillation frequency of the ring oscillator of FIG. 13 can thereby be set to any given value.

Figure 14:
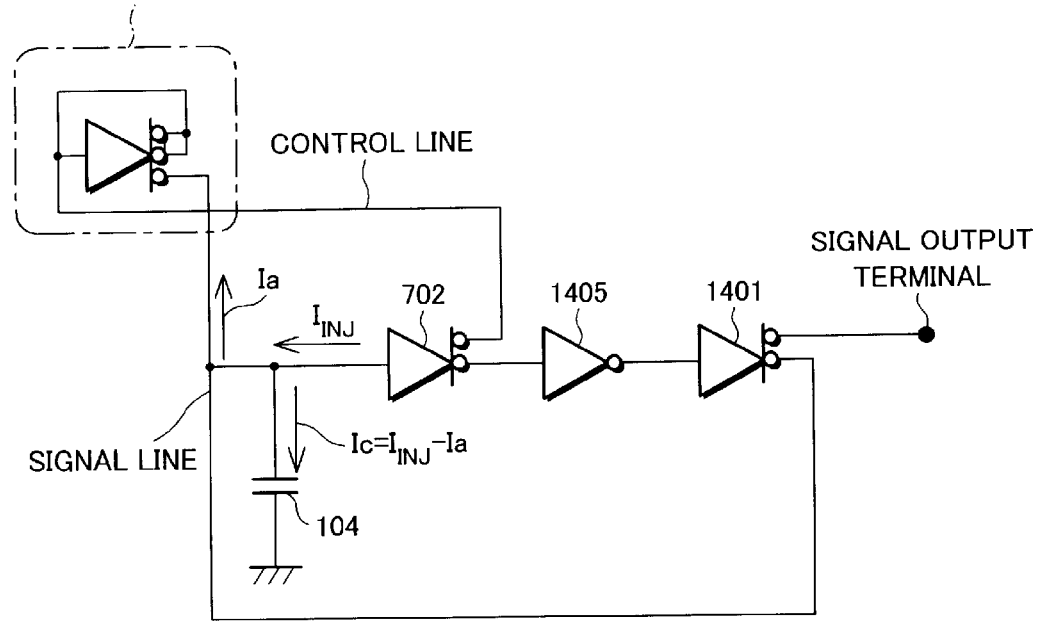
FIG. 14 is a logic circuit diagram of yet another ring oscillator incorporating the delay circuit in accordance with the present invention.

FIG. 14 is a circuit diagram showing a ring oscillator incorporating the delay circuit of FIG. 7 with an additional I²L inverter gate. Here, for convenience, members that have the same function as in FIG. 7 are indicated by the same reference numerals and description thereof is omitted.

The I²L inverter 1401 of FIG. 14 differs from the I²L inverter 101 of FIG. 7 in that the former is provided with two output terminals one of which is extended externally to provide an output terminal, while the other of which is coupled to the input of the I²L inverter 702. Between the I²L inverters 702 and 1401 is provided another I²L inverter 1405.

The ring oscillator of FIG. 14 includes an equivalent of the delay circuit of FIG. 7. In the configuration, once the capacitor 104 is sufficiently charged to develop an input threshold voltage for the I²L inverter 702, causing the output from the I²L inverter 702 to invert from the HIGH level to the LOW level, the input to the I²L inverter constituting the current adjusting circuit 703 falls to the LOW level because of the coupling via the control line.

As a result, the output current Ia from the current adjusting circuit 703 is turned off (cutoff), and the charge current Ic of the capacitor 104 increases from Ic=($I_{INJ}$–Ia) to IC=$I_{INJ}$. Therefore, once the voltage across the capacitor 104 reaches the input threshold voltage of the I²L inverter 702, the voltage across the capacitor 104 is maintained stably.

Therefore, the voltage across the capacitor 104 no longer fluctuates around the input threshold voltage of the I²L inverter 702. The delay circuit is hence stable and supplies a steady output from the I²L inverter 702. Since the charge current Ic (=$I_{INJ}$–Ia) of the capacitor 104 varies in this manner, the delay can be varied precisely, and desired delays will be readily available. The oscillation frequency of the ring oscillator of FIG. 14 can thereby be set to any given value.

As detailed in the foregoing, there is added no separate circuit, such as a gate, but only an output terminal and an control line to the I²L inverter 702; integration is therefore not degraded. Further, in the delay circuit of FIG. 7, the control line effects a current Schmitt function for the charge current Ic of the capacitor 104; a stable output is therefore available even with large delays.

Figure 15:
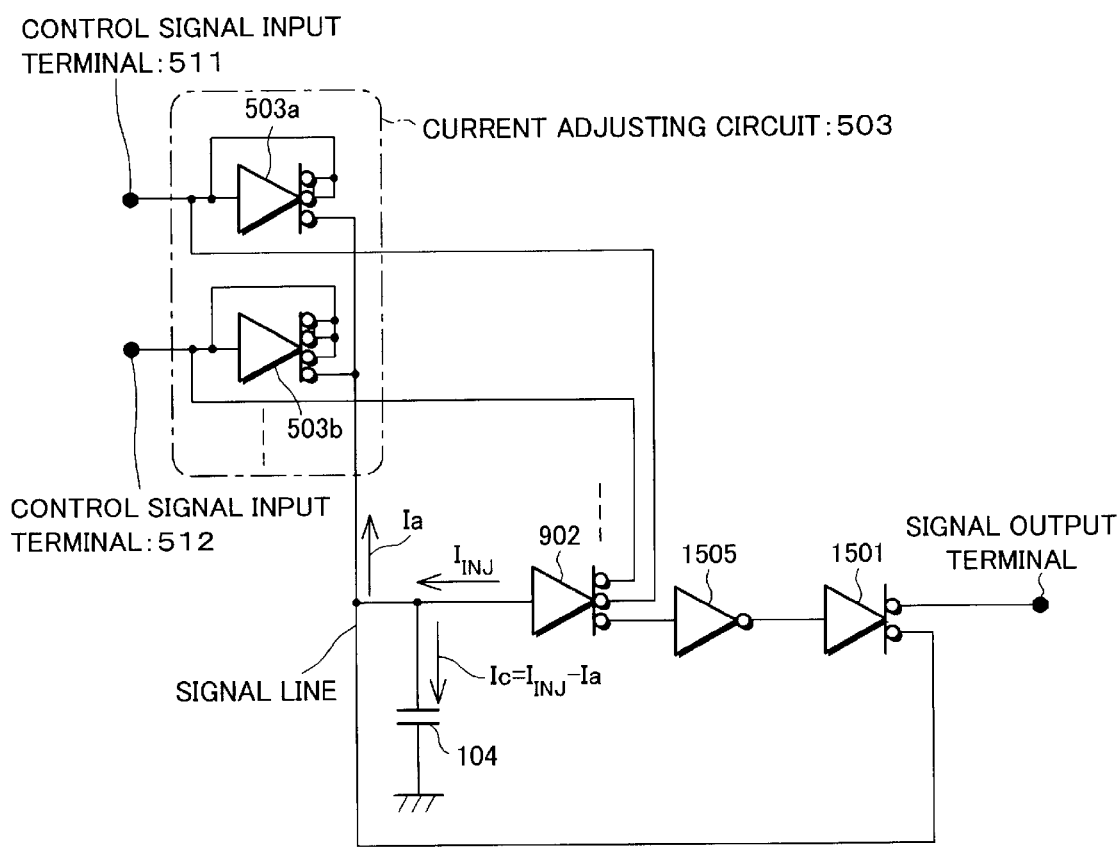
FIG. 15 is a logic circuit diagram of a further ring oscillator incorporating the delay circuit in accordance with the present invention.

FIG. 15 is a circuit diagram showing ring oscillator incorporating the delay circuit of FIG. 9 with an additional I²L inverter gate. Here, for convenience, members that have the same function as in FIG. 9 are indicated by the same reference numerals and description thereof is omitted.

The I²L inverter 1501 of FIG. 15 differs from the I²L inverter 101 of FIG. 9 in that the former is provided with two output terminals one of which is extended externally to provide an output terminal, while the other of which is coupled to the input of the I²L inverter 902. Between the I²L inverters 902 and 1501 is provided another I²L inverter 1505.

By individually controlling (combining) the states of the control signal input terminals 511, 512, etc. of the current adjusting circuit 503, the ring oscillator of FIG. 15 can vary the delay precisely, and desired delays will be readily available. Further, the ring oscillator of FIG. 15, including an equivalent of the delay circuit of FIG. 9, has a current Schmitt function, the voltage across the capacitor 104 no longer fluctuates around the input threshold voltage of the I²L inverter 902. The delay circuit is hence stable and supplies a steady output from the I²L inverter 902 even with large delays.

As detailed in the foregoing, in the ring oscillator of FIG. 15 including an equivalent of the delay circuit of FIG. 9, there is added no separate circuit, such as a gate, but only one or more output terminals to the I²L inverter 902; integration is therefore not degraded. Further, a stable output is available even with large delays due to the current Schmitt function on the charge current Ic of the capacitor 104. Besides, delay switching can be effected externally through the control signal input terminal.

Figure 16:
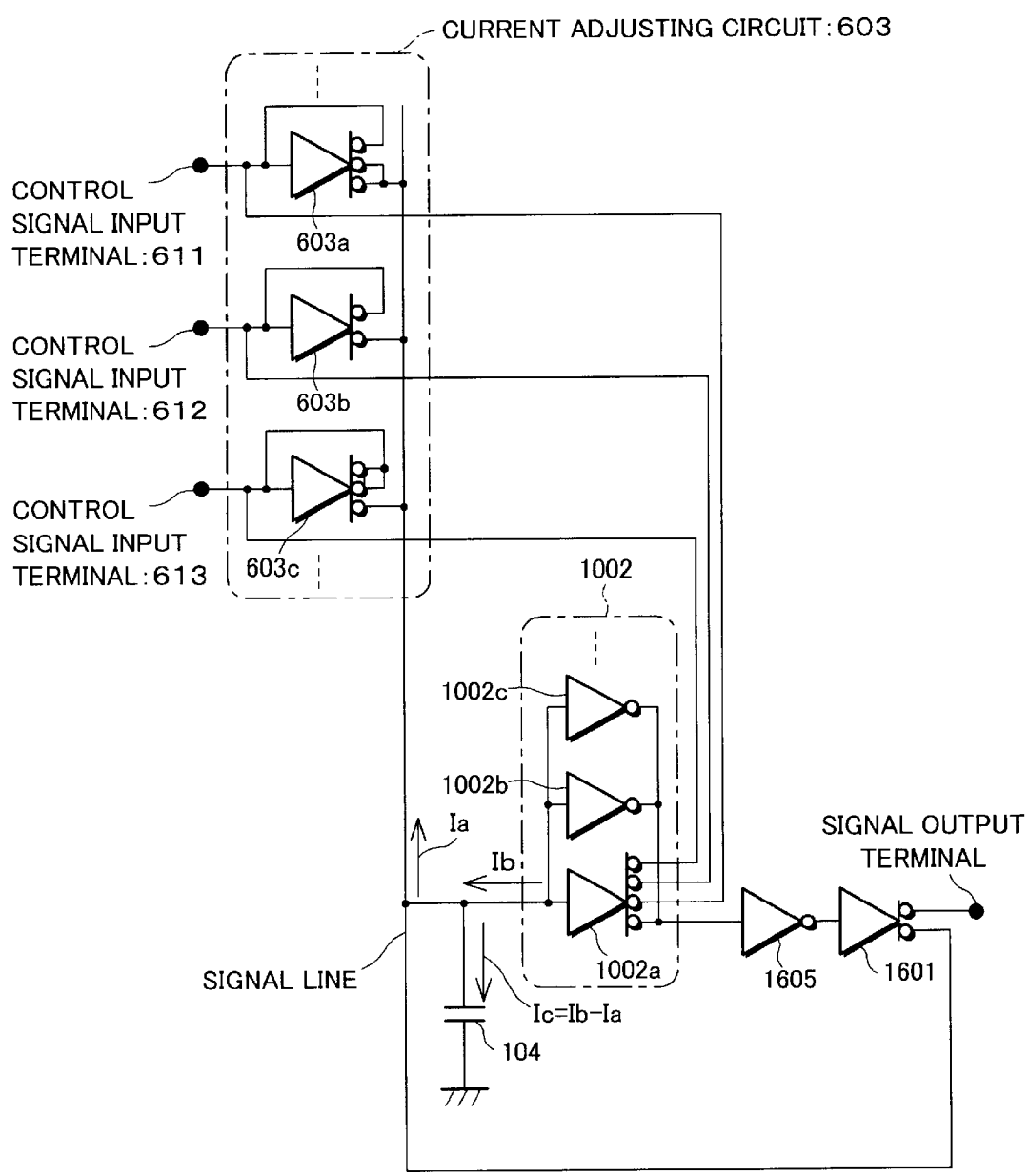
FIG. 16 is a logic circuit diagram of another ring oscillator incorporating the delay circuit in accordance with the present invention.
Figure 17:
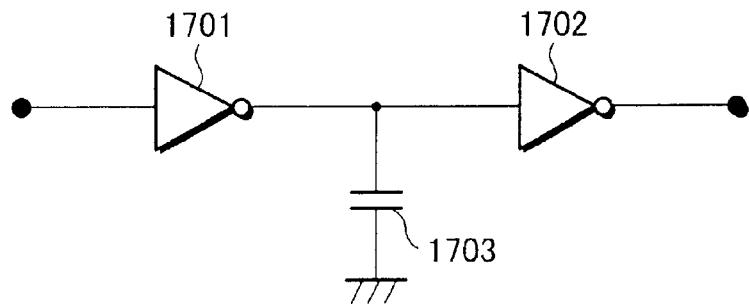
FIG. 17 is a logic circuit diagram showing, as an example, an arrangement of a conventional delay circuit.
Figure 18:
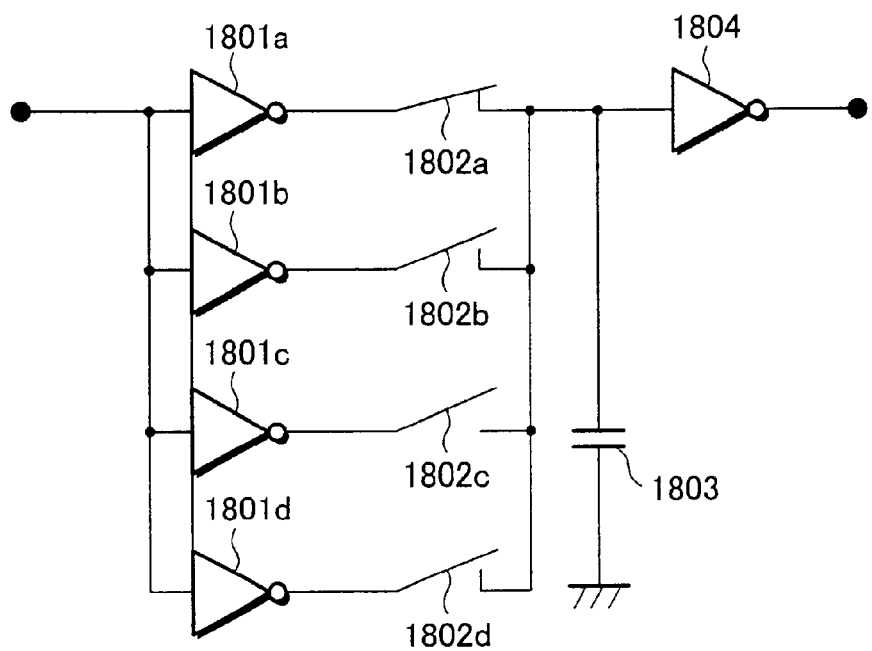
FIG. 18 is a logic circuit diagram showing, as an example, an arrangement of another conventional delay circuit.

FIG. 16 is a circuit diagram showing a ring oscillator incorporating the delay circuit of FIG. 10 with an additional I²L inverter gate. Here, for convenience, members that have the same function as in FIG. 10 are indicated by the same reference numerals and description thereof is omitted.

The I²L inverter 1601 of FIG. 16 differs from the I²L inverter 101 of FIG. 10 in that the former is provided with two output terminals one of which is extended externally to provide an output terminal (signal output terminal), while the other of which is coupled to the input of the I²L inverter 1002. Between the I²L inverter 1002 and 1601 is provided another I²L inverter 1605.

Since the ring oscillator of FIG. 16 includes an equivalent of the delay circuit of FIG. 10, the delay can be precisely varied over a wide range through combinations of the input terminal current Ib of the I²L inverter 1002 and the output current Ia from the current adjusting circuit 603 (variable through the control of the control signal input terminals 611, 612, 613, etc. of the current adjusting circuit 603 between the HIGH impedance and the LOW level) without excessively reducing the charge current Ic of the capacitor 104. Under these conditions, the voltage across the capacitor 104 no longer fluctuates around the input threshold voltage of the I²L inverter 1002. The delay circuit is hence stable and supplies a steady output from the I²L inverter 1002 even with large delays.

As detailed in the foregoing, in the ring oscillator of FIG. 16 including an equivalent of the delay circuit of FIG. 10, there is added no separate circuit, such as a gate, but only one or more output terminals to the I²L inverter 1002; integration is therefore not degraded. Further, a stable output is available even with large delays due to the current Schmitt function on the charge current Ic of the capacitor 104.

Description has been so far made about the configuration in which the outputs of the I²L inverter 1002a constituting the I²L inverter 1002 are coupled to the respective inputs of the current output circuits 603a, 603b, 603c, etc. constituting the current adjusting circuit 603. The present invention, however, is not limited to this configuration; alternatively, the outputs of any one of the I²L inverters 1002b, 1002c, etc. constituting the I²L inverter 1002 may be coupled to those inputs.

Also, the foregoing ring oscillator includes three cascade-connected I²L inverters in all (those I²L inverters in the current adjusting circuit are not counted). The present invention, however, is not limited to this configuration; it is of course sufficient if the ring oscillator includes an odd number of cascade-connected I²L inverters in all.

A first delay circuit in accordance with the present invention, as detailed in the foregoing, includes:

a first I²L inverter;

a second I²L inverter;

a signal line connecting an output terminal of the first I²L inverter to an input terminal of the second I²L inverter; and a capacitor interposed between the signal line and the ground, wherein:

the delay circuit further includes at least one current adjusting circuit having a third I²L inverter with a plurality of output terminals at least one of which is connected to an input terminal of the third I²L inverter; and an output of the current adjusting circuit is connected to the signal line.

In the first delay circuit, a second delay circuit in accordance with the present invention, as detailed in the foregoing, is such that an input of the third I²L inverter is provided with a control signal input terminal to enable switching between delays by a control signal input.

In the second delay circuit, a third delay circuit in accordance with the present invention, as detailed in the foregoing, is such that a plurality of third I²L inverters are connected in parallel.

A fourth delay circuit in accordance with the present invention, as detailed in the foregoing, is such that:

the delay circuit has a control line connecting an output of the second I²L inverter to the input of the third I²L inverter constituting the current adjusting circuit; and an output current of the current adjusting circuit is controlled according to an output of the delay circuit.

In the second delay circuit, a fifth delay circuit in accordance with the present invention, as detailed in the foregoing, is such that:

the delay circuit has at least one control line connecting an output of the second I²L inverter to the input of the third I²L inverter constituting the current adjusting circuit;

an input of the third I²L inverter is provided with a control signal input terminal to enable switching between delays by a control signal input; and an output current of the current adjusting circuit is controlled according to an output of the delay circuit.

In the third delay circuit, the sixth delay circuit in accordance with the present invention, as detailed in the foregoing, is such that a plurality of second I²L inverters are connected in parallel.

A first ring oscillator in accordance with the present invention, as detailed in the foregoing, is such that:

an output of a first or second delay circuit is connected in series to an odd number of I²L inverters; and the output is connected to an input of the first I²L inverter.

In the first ring oscillator, a second ring oscillator in accordance with the present invention, as detailed in the foregoing, is such that the ring oscillator has at least one control line connecting an output of the second I²L inverter to the input of the third I²L inverter constituting the current adjusting circuit.

To obtain desired delays and to provide the capacitor in the form of tiny electrostatic capacitance readily integrated in an integrated circuit, the first to sixth delay circuits each have a current adjusting circuit for adjusting the charge current of the capacitor, and the current adjusting circuit is connected at an output terminal thereof to the input terminal of the second I²L inverter. The charge current of the capacitor is decreased from the injection current, that is, an input terminal current of the second I²L inverter, by means of the output current of the current adjusting circuit. Desired delays are thus produced by means of a capacitor provided as tiny electrostatic capacitance readily integrated in an integrated circuit.

The current adjusting circuit is configured as a current output circuit of a current mirror type based on a third I²L inverter having a plurality of output terminals, in which at least one of the output terminals is connected to an input terminal of the current adjusting circuit, and the injection current of an I²L serves as a reference current. The configuration makes it possible to provide the delay circuit including the current adjusting circuit within an I²L and readily achieve integration in an integrated circuit.

Further, equipping the input of the I²L inverter constituting the current adjusting circuit with a control signal input terminal and supplying a LOW level or HIGH impedance control signal to the control signal input terminal provides means for varying the delay produced by the delay circuit. In this manner, the output current of the current adjusting circuit can be turned on and off, and the delay produced by the delay circuit can be readily varied by a control signal input.

Further, by employing a current adjusting circuit capable of producing a variable output current by means of a plurality of current output circuits based on I²L inverters, the delay circuit can readily vary the delay assuming a plurality of values.

By reducing the charge current of the capacitor by means of the current adjusting circuit, desired large delays become available using a capacitor with a low electrostatic capacitance. A reduced charge current, nevertheless, may cause the output from the second I²L inverter (i.e., the output from the delay circuit) to fluctuate: the terminal voltage of the increasingly charged capacitor, when growing to the input threshold voltage of the second I²L inverter at which the output from the second I²L inverter inverts from the HIGH level to the LOW level, could be susceptible to noise and fluctuate around the input threshold voltage of the second I²L inverter.

Coupling an output of the second I²L inverter to the input of the third I²L inverter constituting the current adjusting circuit via a control line provides means for addressing this inconvenience. In this manner, as soon as the voltage across the increasingly charged capacitor grows to the input threshold voltage of the second I²L inverter and the output of the second I²L inverter inverts from the HIGH level to the LOW level, the input of the third I²L inverter constituting the current adjusting circuit falls to the LOW level because of the coupling via the control line, and the output current from the current adjusting circuit is turned off. By so doing, the charge current of the capacitor increases quickly and the terminal voltage of the capacitor is maintained stably once the terminal voltage reaches the input threshold voltage of the second I²L inverter. Thus, a delay circuit capable of producing a stable output is delivered with an additional output terminal and control line to the second I²L inverter, but no additional gate, without making any compromise on the integration.

Further, by connecting in parallel a plurality of second I²L inverters whose input terminals are connected to the capacitor and providing a current adjusting circuit based on a plurality of current output circuits including a third I²L inverter, the delay produced by the delay circuit can be varied assuming a variety of values over a wide range without excessively reducing the charge current of the capacitor.

The first and second ring oscillators, since incorporating one of the first to sixth delay circuits, include only I²L circuits and a capacitor and is low in electrostatic capacitance, suitable to integration in an integrated circuit, and capable of varying the oscillation frequency by a control signal input.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A delay circuit, comprising:
   a first I²L inverter and a second I²L inverter connected in cascade with each other; and
   a capacitor interposed between a ground and a connecting point of the first and second inverters,
   wherein:
      said delay circuit further comprises at least one third I²L inverter with a plurality of output terminals at least one of which is connected to an input terminal of the third I²L inverter; and
      the third I²L inverter is connected to adjust a charge current of the capacitor.

2. The delay circuit as set forth in claim 1, wherein the third I²L inverter is switchable by a control signal as to whether or not the third I²L inverter will contribute to adjustment of the charge current of the capacitor.

3. The delay circuit as set forth in claim 2, wherein the control signal is supplied to the third I²L inverter via a control signal input terminal of the third I²L inverter.

4. The delay circuit as set forth in claim 3, wherein the third I²L inverter includes: a transistor conducting a reference current; and a plurality of I²L transistors at least one of which is connected to the connecting point, with the remaining I²L transistors connected to a point between the output terminal and the input terminal;
   the plurality of I²L transistors conduct equal amounts of current having a value of the reference current divided by the number of the remaining I²L transistors; and
   the control signal is applied to bases of the plurality of I²L transistors so that the third I²L inverter conducts current when an associated one of the plurality of I²L transistors is on and conducts no current when the associated I²L transistor is off.

5. The delay circuit as set forth in claim 3, wherein the second I²L inverter is realized by a plurality of the second I²L inverters connected in parallel.

6. The delay circuit as set forth in claim 2, wherein the control signal is supplied to the third I²L inverter via the second I²L inverter and causes the third I²L inverter to not contribute to adjustment of the charge current of the capacitor.

7. The delay circuit as set forth in claim 6, wherein the third I²L inverter includes: a transistor conducting a reference current; and a plurality of I²L transistors at least one of which is connected to the connecting point, with the remaining I²L transistors connected to a point between the output terminal and the input terminal;
   the plurality of I²L transistors conduct equal amounts of current having a value of the reference current divided by the number of the remaining I²L transistors; and
   the control signal is applied to bases of the plurality of I²L transistors so that the third I²L inverter conducts current when an associated one of the plurality of I²L transistors is on and conducts no current when the associated I²L transistor is off.

8. The delay circuit as set forth in claim 6, wherein the second I²L inverter is realized by a plurality of the second I²L inverters connected in parallel.

9. The delay circuit as set forth in claim 2, wherein:
   the third I²L inverter includes: a transistor conducting a reference current; and a plurality of I²L transistors at least one of which is connected to the connecting point, with the remaining I²L transistors connected to a point between the output terminal and the input terminal;
   the plurality of I²L transistors conduct equal amounts of current having a value of the reference current divided by the number of the remaining I²L transistors; and
   the control signal is applied to bases of the plurality of I²L transistors so that the third I²L inverter conducts current when an associated one of the plurality of I²L transistors is on and conducts no current when the associated I²L transistor is off.

10. The delay circuit as set forth in claim 9, wherein the second I²L inverter is realized by a plurality of the second I²L inverters connected in parallel.

11. The delay circuit as set forth in claim 2, wherein the second I²L inverter is realized by a plurality of the second I²L inverters connected in parallel.

12. The delay circuit as set forth in claim 1, wherein:
    the third I²L inverter includes: a transistor conducting a reference current; and a plurality of I²L transistors at least one of which is connected to the connecting point, with the remaining I²L transistors connected to a point between the output terminal and the input terminal; and
    the plurality of I²L transistors conduct equal amounts of current having a value of the reference current divided by the number of the remaining I²L transistors.

13. The delay circuit as set forth in claim 12, wherein the second I²L inverter is realized by a plurality of the second I²L inverters connected in parallel.

14. The delay circuit as set forth in claim 1, wherein the second I²L inverter is realized by a plurality of the second I²L inverters connected in parallel.

15. A ring oscillator, comprising a delay circuit including: a first I²L inverter and a second I²L inverter connected in cascade; a capacitor interposed between a ground and a connecting point of the first and second inverters, wherein: said delay circuit further comprises at least one third I²L inverter with a plurality of output terminals at least one of which is connected to an input terminal of the third I²L inverter; and the third I²L inverter is connected to adjust a charge current of the capacitor,
    wherein:
       an odd number of I²L inverters are connected in cascade to an output of the delay circuit; and
       the output is connected to an input of the first I²L inverter.

16. The ring oscillator as set forth in claim 15, wherein the third I²L inverter is switchable by a control signal as to whether or not the third I²L inverter will contribute to adjustment of the charge current of the capacitor.

17. The ring oscillator as set forth in claim 16, wherein the control signal is supplied to the third I²L inverter via a control signal input terminal of the third I²L inverter.

18. The ring oscillator as set forth in claim 17, wherein:

the third I²L inverter includes: a transistor conducting a reference current; and a plurality of I²L transistors at least one of which is connected to the connecting point, with the remaining I²L transistors connected to a point between the output terminal and the input terminal;

the plurality of I²L transistors conduct equal amounts of current having a value of the reference current divided by the number of the remaining I²L transistors; and the control signal is applied to bases of the plurality of I²L transistors so that the third I²L inverter conducts current when an associated one of the plurality of I²L transistors is on and conducts no current when the associated I²L transistor is off.

19. The ring oscillator as set forth in claim 17, wherein the second I²L inverter is realized by a plurality of the second I²L inverters connected in parallel.

20. The ring oscillator as set forth in claim 16, wherein the control signal is supplied to the third I²L inverter via the second I²L inverter and causes the third I²L inverter to not contribute to adjustment of the charge current of the capacitor.

21. The ring oscillator as set forth in claim 20, wherein:

the third I²L inverter includes: a transistor conducting a reference current; and a plurality of I²L transistors at least one of which is connected to the connecting point, with the remaining I²L transistors connected to a point between the output terminal and the input terminal;

the plurality of I²L transistors conduct equal amounts of current having a value of the reference current divided by the number of the remaining I²L transistors; and the control signal is applied to bases of the plurality of I²L transistors so that the third I²L inverter conducts current when an associated one of the plurality of I²L transistors is on and conducts no current when the associated I²L transistor is off.

22. The ring oscillator as set forth in claim 20, wherein the second I²L inverter is realized by a plurality of the second I²L inverters connected in parallel.

23. The ring oscillator as set forth in claim 16, wherein:

the third I²L inverter includes: a transistor conducting a reference current; and a plurality of I²L transistors at least one of which is connected to the connecting point, with the remaining I²L transistors connected to a point between the output terminal and the input terminal; and the plurality of I²L transistors conduct equal amounts of current having a value of the reference current divided by the number of the remaining I²L transistors.

24. The ring oscillator as set forth in claim 23, wherein the second I²L inverter is realized by a plurality of the second I²L inverters connected in parallel.

25. The ring oscillator as set forth in claim 16, wherein:

the third I²L inverter includes: a transistor conducting a reference current; and a plurality of I²L transistors at least one of which is connected to the connecting point, with the remaining I²L transistors connected to a point between the output terminal and the input terminal;

the plurality of I²L transistors conduct equal amounts of current having a value of the reference current divided by the number of the remaining I²L transistors; and the control signal is applied to bases of the plurality of I²L transistors so that the third I²L inverter conducts current when an associated one of the plurality of I²L transistors is on and conducts no current when the associated I²L transistor is off.

26. The ring oscillator as set forth in claim 25, wherein the second I²L inverter is realized by a plurality of the second I²L inverters connected in parallel.

27. The ring oscillator as set forth in claim 16, wherein the second I²L inverter is realized by a plurality of the second I²L inverters connected in parallel.

28. The ring oscillator as set forth in claim 15, wherein the second I²L inverter is realized by a plurality of the second I²L inverters connected in parallel.

* * * * *